United States Patent
Yoshii

(10) Patent No.: US 9,977,299 B2
(45) Date of Patent: May 22, 2018

(54) STATIC ELECTRICITY PROTECTION CIRCUIT, ELECTRO-OPTICAL APPARATUS, AND ELECTRONIC EQUIPMENT

(71) Applicant: Seiko Epson Corporation, Tokyo (JP)

(72) Inventor: Masahito Yoshii, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 224 days.

(21) Appl. No.: 15/025,535

(22) PCT Filed: Oct. 10, 2014

(86) PCT No.: PCT/JP2014/005188
§ 371 (c)(1),
(2) Date: Mar. 28, 2016

(87) PCT Pub. No.: WO2015/052940
PCT Pub. Date: Apr. 16, 2015

(65) Prior Publication Data
US 2016/0238911 A1    Aug. 18, 2016

(30) Foreign Application Priority Data

Oct. 11, 2013  (JP) .................................. 2013-213462

(51) Int. Cl.
*H02H 9/04*  (2006.01)
*G02F 1/1362* (2006.01)
(Continued)

(52) U.S. Cl.
CPC .... *G02F 1/136204* (2013.01); *H01L 27/0266* (2013.01); *H01L 27/0292* (2013.01); *H01L 27/1203* (2013.01)

(58) Field of Classification Search
CPC .......... H02H 9/04; H02H 9/041; H02H 9/046; H01L 2924/0002; H01L 27/0248
(Continued)

(56) References Cited

U.S. PATENT DOCUMENTS 9,030,390 B2 *  5/2015  Toya ..................... H01L 27/124
                                                    315/169.3
9,041,749 B2 *  5/2015  Murayama ............. G09G 3/344
                                                    345/690
(Continued)

FOREIGN PATENT DOCUMENTS

JP    01-276766 A    11/1989
JP    10-303314 A    11/1998
(Continued)

OTHER PUBLICATIONS

CN-201210444076.4; Figures 1-7, specification.*
Search Report received in International Application No. PCT/JP2014/005188; dated Jan. 6, 2015.

*Primary Examiner* — Dharti Patel
(74) *Attorney, Agent, or Firm* — ALG Intellectual Property, LLC

(57) ABSTRACT

A first static electricity protection circuit is provided with a first n-type transistor and a first p-type transistor, a second static electricity protection circuit is provided with at least one of a second n-type transistor and a second p-type transistor, a source is connected with a gate in these transistors, a gate of the first n-type transistor is electrically connected with a low potential power wiring VSS, a drain of the first n-type transistor is electrically connected with a signal wiring SL, a gate of the first p-type transistor is electrically connected with a high potential power wiring VDD, a drain of the first p-type transistor is electrically connected with the signal wiring SL, and a drain of at least one of the second n-type transistor and the second p-type transistor is electrically connected with the low potential power wiring VSS or the high potential power wiring VDD.

6 Claims, 15 Drawing Sheets

(51) Int. Cl.
*H01L 27/02* (2006.01)
*H01L 27/12* (2006.01)

(58) Field of Classification Search
USPC .......................................................... 361/56
See application file for complete search history.

(56) References Cited

U.S. PATENT DOCUMENTS

| | | | |
|---|---|---|---|
| 9,651,831 B2* | 5/2017 | Nakamura | ........ G02F 1/134336 |
| 2002/0146878 A1 | 10/2002 | Ohnakado et al. | |
| 2006/0002045 A1 | 1/2006 | Kobashi | |
| 2006/0023440 A1* | 2/2006 | Miyazawa | .......... H01L 27/3246 |
| | | | 361/792 |
| 2007/0246725 A1 | 10/2007 | Yamazaki | |
| 2009/0174975 A1* | 7/2009 | Huang | ................. G09G 3/3611 |
| | | | 361/56 |
| 2010/0053827 A1 | 3/2010 | Kawano | |
| 2010/0202090 A1 | 8/2010 | Shishido et al. | |
| 2012/0249944 A1 | 10/2012 | Yoshii | |
| 2013/0120334 A1* | 5/2013 | Kim | ..................... G09G 3/3688 |
| | | | 345/208 |
| 2014/0001368 A1* | 1/2014 | Huang | ..................... H02H 9/04 |
| | | | 250/370.09 |

FOREIGN PATENT DOCUMENTS

| | | |
|---|---|---|
| JP | 2002-305254 A | 10/2002 |
| JP | 2005-135991 A | 5/2005 |
| JP | 2005-167212 A | 6/2005 |
| JP | 2006-018165 A | 1/2006 |
| JP | 2006-114711 A | 4/2006 |
| JP | 2010-041013 A | 2/2010 |
| JP | 2010-206186 A | 9/2010 |
| JP | 2011-018775 A | 1/2011 |
| KR | 2012-0112140 A | 10/2012 |

* cited by examiner

STATIC ELECTRICITY PROTECTION CIRCUIT, ELECTRO-OPTICAL APPARATUS, AND ELECTRONIC EQUIPMENT

TECHNICAL FIELD

The present invention relates to a static electricity protection circuit, an electro-optical apparatus where the static electricity protection circuit is mounted, and electronic equipment.

BACKGROUND ART

An active driving type liquid crystal apparatus which is an electro-optical apparatus has pixels which modulate light, a semiconductor circuit (a scan line driving circuit, a data line driving circuit, and the like) which drives the pixels, and the like. In the liquid crystal apparatus, there is a concern that transistors which configure pixels, semiconductor circuits, or the like will suffer irreparable electrostatic damage due to static electricity and electrostatic countermeasures which suppress the influence of static electricity are important. For example, PTL 1 proposes a liquid crystal apparatus which is provided with an electrostatic protection circuit (a static electricity protection circuit).

FIG. 16 is a circuit diagram of the static electricity protection circuit described in PTL 1. As shown in FIG. 16, a static electricity protection circuit 500 described in PTL 1 has a p-type transistor 504 and an n-type transistor 505. The source and gate of the p-type transistor 504 are connected with a high potential wiring 502 and a potential VH is supplied thereto. The source and gate of the n-type transistor 505 are connected with a low potential wiring 503 and a potential VL which is a lower potential than the potential VH is supplied thereto. The drain of the p-type transistor 504 and the drain of the n-type transistor 505 are connected with a signal wiring 501.

In a case where the potential of the signal wiring 501 is in a range of VL to VH, the p-type transistor 504 and the n-type transistor 505 are in an OFF state and the liquid crystal apparatus operates normally without electrical interference from the signal wiring 501, the high potential wiring 502, or the low potential wiring 503. When the potential of the signal wiring 501 is outside of the range of VL to VH due to static electricity, one of the p-type transistor 504 and the n-type transistor 505 is in an ON state (a conductive state). For example, when the potential of the signal wiring 501 is greater than VH due to static electricity, the p-type transistor 504 is in the ON state. When the potential of the signal wiring 501 is lower than VL due to static electricity, the n-type transistor 505 is in the ON state. In this manner, when the potential of the signal wiring 501 changes due to static electricity, one of the high potential wiring 502 and the low potential wiring 503 is in a conductive state and so is the signal wiring 501. Then, an electrical charge which is applied to the signal wiring 501 due to static electricity is distributed (discharged) to whichever one of the high potential wiring 502 or the low potential wiring 503 is in the conductive state and the changes in the potential of the signal wiring 501 due to static electricity are reduced. Since changes in the potential of the signal wiring 501 due to static electricity are reduced, it is difficult for the semiconductor circuit which is connected with the signal wiring 501 to suffer irreparable electrostatic damage (for example, electrostatic breakdown).

CITATION LIST

Patent Literature

[PTL 1]
JP-A-2006-18165

SUMMARY OF INVENTION

Technical Problem

As described above, the liquid crystal apparatus described in PTL 1 has the static electricity protection circuit 500 which discharges an electrical charge which is applied to the signal wiring 501 due to static electricity to either of the high potential wiring 502 or the low potential wiring 503.

However, in a case where an electrical charge due to static electricity is applied to either of the high potential wiring 502 or the low potential wiring 503 in the static electricity protection circuit 500 described above, it is difficult to discharge the electrical charge. For this reason, when an electrical charge due to static electricity is applied to the high potential wiring 502, the potential of the high potential wiring 502 changes and there is a concern that the transistor (for example, the p-type transistor 504) which is electrically connected with the high potential wiring 502 will suffer irreparable electrostatic damage. When an electrical charge due to static electricity is applied to the low potential wiring 503, the potential of the low potential wiring 503 changes and there is a concern that the transistor (for example, the n-type transistor 505) which is electrically connected with the low potential wiring 503 will suffer irreparable electrostatic damage.

In this manner, in the liquid crystal apparatus described in PTL 1, there is a problem in that it is difficult to suppress influence of static electricity with respect to the high potential wiring 502 or the low potential wiring 503.

Solution to Problem

The invention has been made in order to solve at least a part of the problems described above and it can be realized in the following forms or application examples.

Application Example 1

A static electricity protection circuit according to this application example has a first static electricity protection circuit, a second static electricity protection circuit, a first power wiring, a second power wiring, and a signal wiring, where each of the first static electricity protection circuit and the second static electricity protection circuit is respectively electrically connected with the first power wiring, the second power wiring, and the signal wiring, the first static electricity protection circuit is provided with a first transistor and a second transistor, the second static electricity protection circuit is provided with a third transistor, the first transistor is an n-type transistor, the second transistor is a p-type transistor, the third transistor is either an n-type or a p-type transistor, one out of a source and a drain of each of the first transistor, the second transistor, and the third transistor is electrically connected with a gate, the gate of the first transistor is electrically connected with the first power wiring, the other out of the source and the drain of the first transistor is electrically connected with the signal wiring, the gate of the second transistor is electrically connected with the second power wiring, the other out of the source and the drain of the second transistor is electrically connected with the signal wiring, and the other out of the source and the drain of the third transistor is electrically connected with the first power wiring or the second power wiring.

The first static electricity protection circuit is provided with the first transistor and the second transistor. When a positive electrical charge is applied to the signal wiring due to static electricity, the gate of the first transistor has a negative potential with respect to the other out of the source and the drain and the first transistor is in a non-conductive state, and the gate of the second transistor has a negative potential with respect to the other out of the source and the drain and the second transistor is in a conductive state. For this reason, the positive electrical charge which is applied to the signal wiring due to static electricity is discharged to the second power wiring via the second transistor which is in the conductive state. When a negative electrical charge is applied to the signal wiring due to static electricity, the gate of the first transistor has a positive potential with respect to the other out of the source and the drain and the first transistor is in a conductive state, and the gate of the second transistor has a positive potential with respect to the other out of the source and the drain and the second transistor is in a non-conductive state. For this reason, the negative charge which is applied to the signal wiring due to static electricity is discharged to the first power wiring via the first transistor which is in the conductive state. That is, the first static electricity protection circuit discharges the electrical charge which is applied due to static electricity to either of the first power wiring or the second power wiring and has a role of suppressing the influence of the electrical charge.

The second static electricity protection circuit is provided with a third transistor which is either an n-type or a p-type and the other out of the source and the drain is electrically connected with the first power wiring or the second power wiring. A static electrical charge which is applied to the first power wiring or the second power wiring due to static electricity is discharged to the side of the wiring where one out of the source and the drain is connected via the other out of the source and the drain which is electrically connected with the first power wiring or the second power wiring. That is, the second static electricity protection circuit discharges an electrical charge which is applied to the first power wiring or the second power wiring and has a role of suppressing the influence of the static electricity with respect to the first power wiring or the second power wiring.

In this manner, the static electricity protection circuit according to this application example has a static electricity protection circuit (the first static electricity protection circuit) which suppresses the influence of static electricity with respect to the signal wiring and a static electricity protection circuit (the second static electricity protection circuit) which suppresses the influence of static electricity with respect to the first power wiring or the second power wiring. Here, high potential wiring and low potential wiring in the technique (JP-A-2006-18165) known in the art correspond to the first power wiring and the second power wiring in this application example. Accordingly, the static electricity protection circuit according to this application example overcomes the problem in the techniques known in the art such as that it is difficult to suppress the influence of static electricity with respect to the high potential wiring or the low potential wiring (the first power wiring or the second power wiring) and suppresses the influence of static electricity with respect to the first power wiring and the second power wiring in addition to the signal wiring and it is difficult for elements (for example, transistors) which are electrically connected with the signal wiring, the first power wiring, and the second power wiring to suffer irreparable electrostatic damage.

Application Example 2

In the static electricity protection circuit described in the application example described above, preferably, the second static electricity protection circuit is provided with a fourth transistor, the third transistor is an n-type transistor, the fourth transistor is a p-type transistor, one out of a source and a drain of the fourth transistor is electrically connected with a gate, the gate of the third transistor and the other out of the source and the drain of the fourth transistor are electrically connected with the first power wiring, and the gate of the fourth transistor and the other out of the source and the drain of the third transistor are electrically connected with the second power wiring.

The second static electricity protection circuit is provided with the third transistor and the fourth transistor. When a positive electrical charge is applied to the first power wiring due to static electricity, the gate of the third transistor has a positive potential with respect to the other out of the source and the drain and the third transistor is in a conductive state, and the gate of the fourth transistor has a negative potential with respect to the other out of the source and the drain and the fourth transistor is also in a conductive state. Thus, it is possible to discharge a positive electrical charge which is applied to the first power wiring due to static electricity to the second power wiring via the third transistor and the fourth transistor which are in the conductive state.

When a negative electrical charge is applied to the second power wiring due to static electricity, the gate of the third transistor has a positive potential with respect to the other out of the source and the drain and the third transistor is in a conductive state, and the gate of the fourth transistor has a negative potential with respect to the other out of the source and the drain and the fourth transistor is also in a conductive state. Thus, it is possible to discharge a negative electrical charge which is applied to the second power wiring due to static electricity to the first power wiring via the third transistor and the fourth transistor which are in the conductive state.

Application Example 3

In the static electricity protection circuit in the application example described above, preferably, the second static electricity protection circuit has a higher resistance than the first static electricity protection circuit.

The signal wiring is a wiring which supplies a signal for driving the electro-optical apparatus. The first power wiring and the second power wiring are wirings which supply electrical power to the constituent elements (for example, a driver) of the electro-optical apparatus and conduct large currents compared to the signal wiring. For this reason, it is necessary for the first power wiring and the second power wiring to have a greater wiring capacitance than the signal wiring and to easily conduct a larger current than the signal wiring. For this reason, the area of the first power wiring and the second power wiring is larger than the area of the signal wiring.

Assuming a case where there is a source of static electricity, it is easier for the first power wiring and the second power wiring with a large area to be charged by static than the signal wiring with a small area (the influence of the static electricity is greater). Furthermore, the amount of static charge (the accumulated amount of electrical charge) due to static electricity is increased in the first power wiring and the second power wiring with a large area compared to the signal wiring with a small area. For this reason, since the amount of the electrical charge which is applied due to static electricity is greater in the first power wiring and the second power wiring compared to the signal wiring, in a case where the electrical charge which is applied due to the static electricity is discharged in the second static electricity protection circuit, there is a concern that a large current (an excessive current) will flow in the second static electricity protection circuit and the transistor which configures the second static electricity protection circuit will break. Since the second static electricity protection circuit has a higher resistance than the first static electricity protection circuit, the excessive current described above is suppressed and it is difficult for the second static electricity protection circuit to break. Accordingly, it is possible to operate the second static electricity protection circuit in a stable manner and for a long time.

Application Example 4

In the static electricity protection circuit according to the application example described above, preferably, the first transistor and the third transistor have substantially the same channel width, the second transistor and the fourth transistor have substantially the same channel width, a channel length of the third transistor is 120% of the channel length of the first transistor or is longer than 120%, and the channel length of the fourth transistor is 120% of the channel length of the second transistor or is larger than 120%.

The first transistor and the third transistor have substantially the same channel width and the channel length of the third transistor is 120% of the channel length of the first transistor or is longer than 120% of the channel length of the first transistor. Thus, the third transistor has a higher resistance than the first transistor. In the same manner, the second transistor and the fourth transistor have substantially the same channel width and the channel length of the fourth transistor is 120% of the channel length of the second transistor or is longer than 120% of the channel length of the second transistor. Thus, the fourth transistor has a higher resistance than the second transistor.

Accordingly, the second static electricity protection circuit which is configured by the third transistor and the fourth transistor has a higher resistance than the first static electricity protection circuit which is configured by the first transistor and the second transistor.

Application Example 5

An electro-optical apparatus according to this application example is provided with the static electricity protection circuit according to the application examples described above.

Since the electro-optical apparatus according to this application example is provided with the static electricity protection circuit according to the application examples described above, the influence of the static electricity is suppressed and it is possible to increase the resistance with respect to static electricity, that is, the reliability of the electro-optical apparatus.

Application Example 6

Electronic equipment according to this application example is provided with the static electricity protection circuit according to the application examples described above and the electro-optical apparatus according to the application example described above.

Since the electronic equipment according to this application example is provided with the static electricity protection circuit according to the application examples described above and the electro-optical apparatus which has the static electricity protection circuit according to the application examples described above, the influence of the static electricity is suppressed and it is possible to increase the resistance with respect to static electricity, that is, the reliability of the electronic equipment.

DESCRIPTION OF EMBODIMENTS

Below, description will be given of embodiments of the invention with reference to the diagrams. These embodiments illustrate one aspect of the invention and are able to be changed arbitrarily within the range of the technical concept of the invention without limiting the invention. In addition, the scale of each of the layers or each of the parts is reduced to be different from the actual scale in each of the diagrams below so that each of the layers or each of the parts is a recognizable size in the diagrams.

Embodiment 1

[Summary of Liquid Crystal Apparatus]

A liquid crystal apparatus 100 according to Embodiment 1 is an example of an electro-optical apparatus and a transmission type liquid crystal apparatus which is provided with a thin film transistor (referred to below as a TFT) 30.

The liquid crystal apparatus 100 according to the present embodiment is able to be favorably used, for example, as an optical modulator (a light valve) of a projection type display apparatus (a liquid crystal projector) which will be described below.

Figure 1:
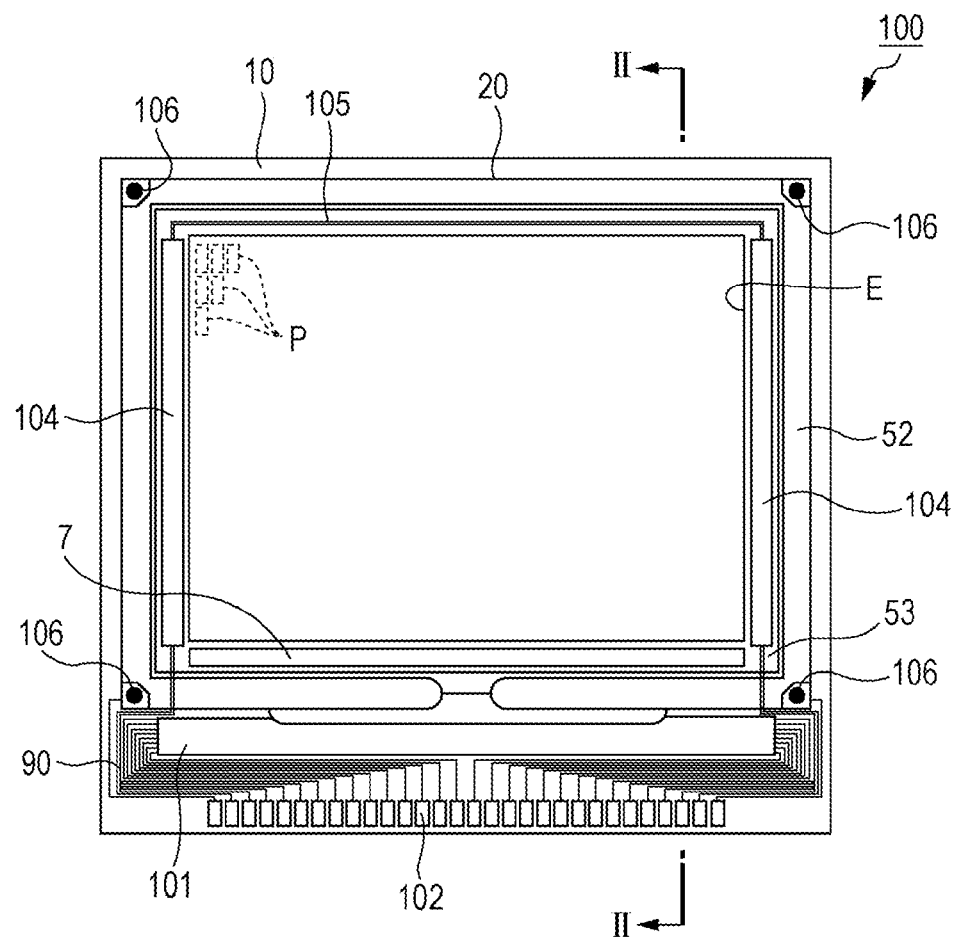
FIG. 1 is a schematic planar diagram which illustrates a structure of a liquid crystal apparatus according to Embodiment 1.
Figure 2:
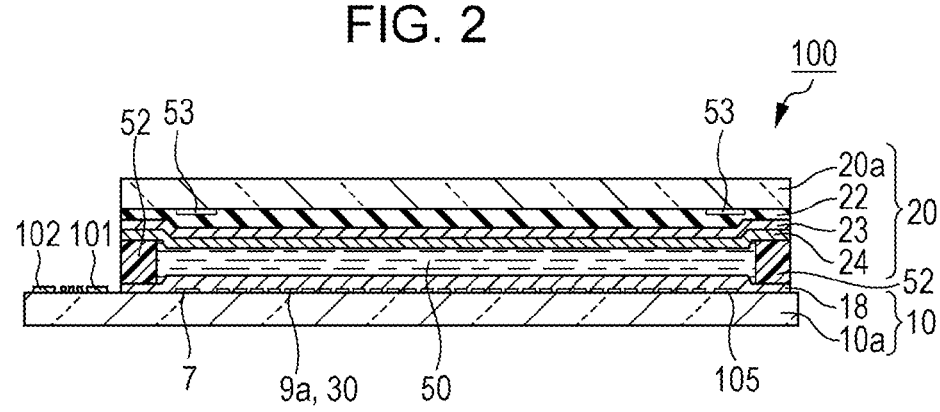
FIG. 2 is a schematic cross-sectional diagram taken along a line II-II in FIG. 1.
Figure 3A:
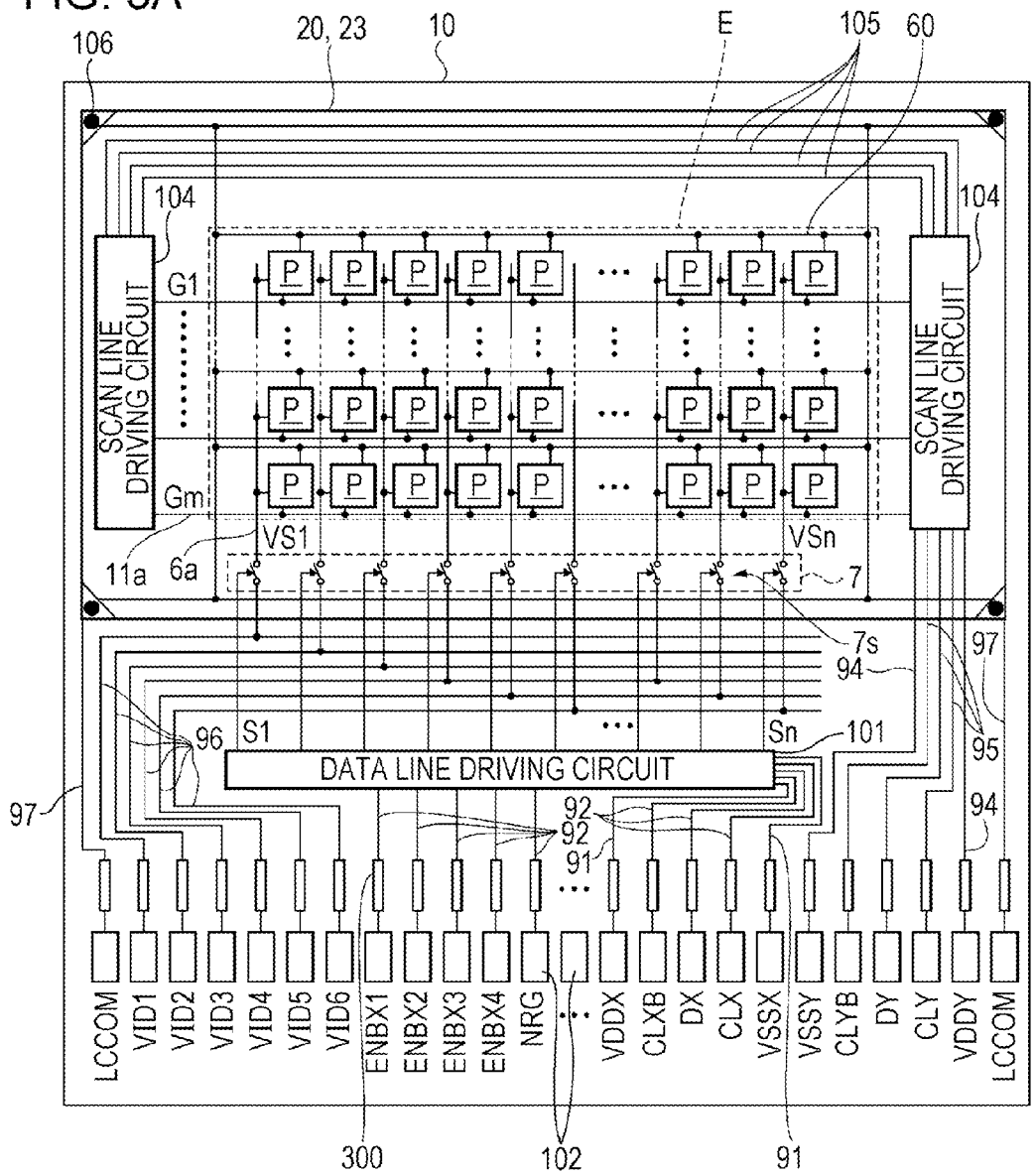
FIG. 3A is a circuit diagram which illustrates a main circuit configuration of the liquid crystal apparatus according to Embodiment 1.
Figure 3B:
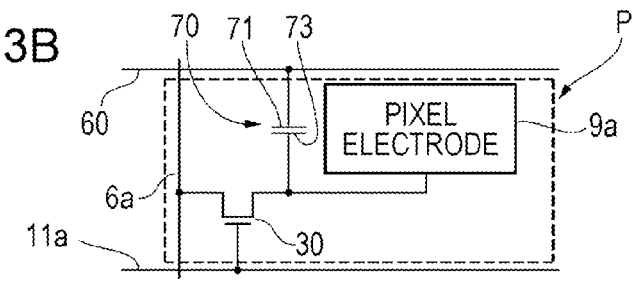
FIG. 3B is a circuit diagram which illustrates a main circuit configuration of the liquid crystal apparatus according to Embodiment 1.

Firstly, description will be given of the entire configuration of the liquid crystal apparatus 100 as the electro-optical apparatus according to the present embodiment with reference to FIG. 1 to FIG. 3B. FIG. 1 is a schematic planar diagram which illustrates a configuration of the liquid crystal apparatus. FIG. 2 is a schematic cross-sectional diagram taken along the line II-II in FIG. 1. FIG. 3A is a circuit diagram of the liquid crystal apparatus and FIG. 3B is a diagram of a pixel equivalent circuit.

As shown in FIG. 1 and FIG. 2, the liquid crystal apparatus 100 according to the present embodiment has an element substrate 10 and a counter substrate 20 which are arranged to be opposed to each other, a liquid crystal layer 50 which is interposed by this pair of substrates, and the like.

The element substrate 10 is larger than the counter substrate 20 and both of the substrates are adhered via a sealing material 52 which is arranged in a frame shape and the liquid crystal layer 50 is configured of liquid crystal, which has positive or negative dielectric anisotropy, being enclosed in the gap between the substrates. The sealing material 52 is, for example, an adhesive agent such as thermosetting or ultraviolet curable epoxy resin and a spacer (omitted from the diagram) for holding the pair of substrates at a constant interval is mixed therein.

Inside the sealing material 52 which is arranged in a frame shape, a shielding film 53 is provided in a frame shape in the same manner. The shielding film 53 is formed of, for example, a metal, a metallic compound, or the like with a light shielding property and the inside of the shielding film 53 is a display region E. A plurality of pixels P are arranged in a matrix form in the display region E.

A data line driving circuit 101 is provided between a first side where a plurality of external circuit connection terminals 102 of the element substrate 10 are disposed and the sealing material 52 along the first side. A sampling circuit 7 is provided between the sealing material 52 along the first side and the display region E. A scan line driving circuit 104 is provided between the sealing material 52 along a second side and a third side which intersect orthogonally with the first side and are opposed to each other and the display region E. A wiring 105 which joins two scan line driving circuits 104 is provided between the sealing material 52 along a fourth side which is opposed to the first side and the display region E. Furthermore, a routing wiring 90 is provided for electrically connecting the data line driving circuit 101, the sampling circuit 7, and the scan line driving circuit 104 with the external circuit connection terminal 102.

The data line driving circuit 101 includes a pre-charge circuit.

As shown in FIG. 2, the element substrate 10 has a substrate body 10a, a TFT 30 and a pixel electrode 9a which are formed on the surface on the liquid crystal layer 50 side of the substrate body 10a, an oriented film 18 which covers the pixel electrode 9a, and the like. The substrate body 10a is configured of, for example, a transparent material such as quartz or glass. In addition, the TFT 30 and the pixel electrode 9a are constituent elements of the pixel P. Description will be given below of the details of the pixel P.

Furthermore, although not shown in the diagram, a static electricity protection circuit 300 (refer to FIG. 3A) which will be described below is provided on the element substrate 10 in addition to the data line driving circuit 101, the sampling circuit 7, and the scan line driving circuit 104. In addition to this, a semiconductor circuit such as an inspection circuit for inspecting the quality, defects, or the like of the liquid crystal apparatus 100 during manufacturing or at the time of shipping may be provided.

The counter substrate 20 has a counter substrate body 20a, the shielding film 53, an insulating film 22, a counter electrode 23, an oriented film 24, and the like which are laminated in order on the surface on the liquid crystal layer 50 side of the counter substrate body 20a. The counter substrate body 20a is configured of, for example, a transparent material such as quartz or glass.

The shielding film 53 overlaps in a planar manner with the sampling circuit 7, the scan line driving circuit 104, and the like as shown in FIG. 1 and has a role of preventing erroneous operation of these circuits due to light by shielding light which is incident from the counter substrate 20 side. In addition, the shielding film 53 secures a high contrast in the display of the display region E by acting as a shield such that unnecessary stray light is not incident in the display region E.

The insulating film 22 is formed of, for example, an inorganic material such as silicon oxide and is provided to have optical transparency and cover the shielding film 53. In addition, the insulating film 22 also functions as a planarization layer which lessens unevenness which is generated on the substrate due to the shielding film 53.

The counter electrode 23 is formed of, for example, a transparent conductive film such as ITO and is formed over the display region E as well as covering the insulating film 22. The counter electrode 23 is electrically connected with the wiring on the element substrate 10 side by vertical conductive sections 106 which are provided at the four corners of the counter substrate 20 as shown in FIG. 1.

The oriented film 18 which covers the pixel electrode 9a and the oriented film 24 which covers the counter electrode 23 are set based on an optical design of the liquid crystal apparatus 100 and are configured by an oblique vapor deposition film (an inorganic oriented film) of an inorganic material such as silicon oxide in the present embodiment. In addition, an organic oriented film such as polyimide may be used for the oriented films 18 and 24.

As shown in FIG. 3A, a potential of a low potential power VSSY and a potential of a high potential power VDDY are supplied from an external circuit to the scan line driving circuit 104 via the external circuit connection terminal 102 and a scan line driving circuit power wiring 94. The potential of the low potential power VSSY is a ground potential (a reference potential), that is, the lowest potential out of the potentials which are supplied to the scan line driving circuit 104. The potential of the high potential power VDDY is higher than the potential of the low potential power VSSY and is the highest potential out of the potentials which are supplied to the scan line driving circuit 104. Furthermore, a Y clock signal CLY, a reverse Y clock signal CLYB, and a Y start pulse signal DY are supplied from an external circuit to the scan line driving circuit 104 via the external circuit connection terminal 102 and a scan line driving circuit signal wiring 95. The scan line driving circuit 104 sequentially generates scan signals G1 to Gm based on these signals and outputs the generated signals to a scan line 11a.

The potential of a low potential power VSSX and the potential of a high potential power VDDX are supplied from an external circuit to the data line driving circuit 101 via the external circuit connection terminal 102 and a data line driving circuit power wiring 91. The potential of the low potential power VSSX is a ground potential (a reference potential), that is, the lowest potential out of the potentials which are supplied to the data line driving circuit 101. The potential of the high potential power VDDX is higher than the potential of the low potential power VSSX and is the highest potential out of the potentials which are supplied to the data line driving circuit 101. Furthermore, an X clock signal CLX, a reverse X clock signal CLXB, an X start pulse signal DX, data enable signals ENBX1, ENBX2, ENBX3, and ENBX4, and a pre-charge signal NRG are supplied from an external circuit to the data line driving circuit 101 via the external circuit connection terminal 102 and a data line driving circuit signal wiring 92. The data line driving circuit 101 sequentially generates and outputs sampling signals S1 to Sn at a timing based on the X clock signal CLX (and the reverse X clock signal CLXB) when the X start pulse signal DX is input.

A common potential LCCOM is supplied from an external circuit to the counter electrode 23 via the external circuit connection terminal 102 and a common electrode wiring 97. Furthermore, the common potential LCCOM is supplied to one electrode (a lower electrode 71) which forms an additional capacitor 70 via the common electrode wiring 97 and a capacitor line 60 (refer to FIG. 3B).

The sampling circuit 7 is provided with sampling transistors 7s which samples video signals VID1 to VID6 and supplies the sampled signals to a data line 6a. The data line 6a is connected with a video signal line 96 via the sampling transistor 7s. Potentials of the video signals VID1 to VID6 are supplied to the sampling circuit 7 via the external circuit connection terminal 102 and the video signal line 96. Furthermore, the sampling signals S1 to Sn are supplied from the data line driving circuit 101 to the sampling circuit 7 for each of the sampling transistors 7s. When the sampling signals S1 to Sn are input, the sampling circuit 7 sequentially supplies video signals VS1 to VSn according to the sampling signals S1 to Sn to the data line 6a which corresponds to the sampling transistor 7s.

As shown in FIG. 3A and FIG. 3B, the display region E is provided with a plurality of scan lines 11a and a plurality of data lines 6a as signal lines which intersect orthogonally and are insulated from each other, and the capacitor line 60 which extends in parallel with respect to the scan line 11a. The pixel electrode 9a, the TFT 30, and the additional capacitor 70 are provided in the region which is divided by the scan line 11a and the data line 6a and these configure a pixel circuit of the pixel P.

The data line 6a to which the video signals VS1 to VSn are supplied is electrically connected with a source electrode of the TFT 30. The video signals VS1 to VSn which are written to the data line 6a may be supplied line-sequentially in this order or may also be supplied for each of the groups with respect to a plurality of the data lines 6a which are adjacent to each other. In the present embodiment, the video signals VS1 to VSn correspond to each of the video signals VID1 to VID6 which are arranged in series-parallel in six phases and are supplied for each of the groups with respect to a group of six data lines 6a. The phase arrangement number of the video signals (that is, the sequence number of the video signals which are arranged in series-parallel) is not limited to six phases and, for example, there may be a configuration where video signals, which are arranged in a plurality of phases such as nine phases, twelve phases, or twenty four phases, are supplied with respect to a group of the data lines 6a which are grouped in a number which corresponds to the phase arrangement number of the video signals.

The scan line 11a to which the scan signal is supplied is connected with a gate electrode 3a (refer to FIG. 4) of the TFT 30. Scan signals G1 to Gm are line-sequentially supplied to the scan line 11a and the gate electrode 3a in this order. The pixel electrode 9a is electrically connected with a drain electrode of the TFT 30.

The liquid crystal apparatus 100 is configured such that the video signals VS1 to VSn which are supplied from the data line 6a are written to the pixel electrode 9a at a predetermined timing via the TFT 30 by the TFT 30, which is a switching element, being in the ON state for a certain period due to the input of the scan signals G1 to Gm. Then, the video signals VS1 to VSn of a predetermined level which are written to the liquid crystal layer 50 via the pixel electrode 9a are held for a certain period between the pixel electrode 9a and the counter electrode 23 which is arranged to be opposed thereto via the liquid crystal layer 50.

The additional capacitor 70 is added in parallel with a liquid crystal capacitor which is formed between the pixel electrode 9a and the counter electrode 23 in order to prevent the video signals VS1 to VSn which are held from leaking. The additional capacitor 70 is provided between the drain of the TFT 30 and the capacitor line 60. The additional capacitor 70 has an upper electrode 73, which is connected with the pixel electrode 9a, and the lower electrode 71, which is connected with the capacitor line 60. As described above, a common potential LCCOM is supplied to the lower electrode 71 via the common electrode wiring 97 and the capacitor line 60.

The liquid crystal apparatus 100 is a transmission type apparatus and adopts an optical design with a normally white mode with a clear display where the transmission rate of the pixels P when a voltage is not applied is greater than the transmission rate when a voltage is applied or a normally black mode with a dark display where the transmission rate of the pixels P when a voltage is not applied is smaller than the transmission rate when a voltage is applied. According to the optical design, the liquid crystal apparatus 100 is used by arranging polarizing elements (omitted from the diagram) at each of the light incident side and the light irradiation side.

[Summary of Wiring and Arrangement of Static Electricity Protection Circuit]

Next, description will be given of a summary of a wiring which is provided in the liquid crystal apparatus 100 and an arrangement position of the static electricity protection circuit 300 which has the characteristics of the invention with reference to FIG. 3A.

As described above, the liquid crystal apparatus 100 has a data line driving circuit power wiring 91 for supplying power to the data line driving circuit 101, a data line driving circuit signal wiring 92 for supplying a signal for driving to the data line driving circuit 101, a scan line driving circuit power wiring 94 for supplying power to the scan line driving circuit 104, a scan line driving circuit signal wiring 95 for supplying a signal for driving to the scan line driving circuit 104, the video signal line 96 for supplying video signals VID1 to VID6 to the sampling circuit 7, the common electrode wiring 97 for supplying a common potential LCCOM to the common electrode (the counter electrode 23 and the lower electrode 71), and the like.

Furthermore, the liquid crystal apparatus 100 has a static electricity protection circuit 300 which has the characteristics of the invention.

A potential of the low potential power VSSX is supplied to one data line driving circuit power wiring 91 and a potential (a high potential) of the high potential power VDDX is supplied to the other data line driving circuit power wiring 91. Furthermore, a potential of the low potential power VSSY is supplied to one scan line driving circuit power wiring 94 and a potential of the high potential power VDDY is supplied to the other scan line driving circuit power wiring 94.

The data line driving circuit power wiring 91 to which a potential of the low potential power VSSX is supplied and the scan line driving circuit power wiring 94 to which a potential of the low potential power VSSY is supplied are an example of a "first power wiring" in the invention and are referred to below as the low potential power wiring VSS.

The data line driving circuit power wiring 91 to which a potential of the high potential power VDDX is supplied and the scan line driving circuit power wiring 94 to which a potential of the high potential power VDDY is supplied are an example of a "second power wiring" in the invention and are referred to below as the high potential power wiring VDD.

The Y clock signal CLY, the reverse Y clock signal CLYB, the Y start pulse signal DY, and the like are supplied to the scan line driving circuit signal wiring 95. The X clock signal CLX, the reverse X clock signal CLXB, the X start pulse signal DX, the data enable signals ENBX1, ENBX2, ENBX3, and ENBX4, and the pre-charge signal NRG are supplied to the data line driving circuit signal wiring 92. The video signals VID1 to VID6 are supplied to the video signal line 96. A common potential LCCOM is supplied to the common electrode wiring 97.

Potentials of the Y clock signal CLY, the reverse Y clock signal CLYB, the Y start pulse signal DY, the X clock signal CLX, the reverse X clock signal CLXB, the X start pulse signal DX, the data enable signals ENBX1, ENBX2, ENBX3, and ENBX4, the pre-charge signal NRG, the video signals VID1 to VID6, and the common potential LCCOM are between the potential of the low potential power wiring VSS and the potential of the high potential power wiring VDD.

In other words, the potentials of the data line driving circuit signal wiring 92, the scan line driving circuit signal wiring 95, the video signal line 96, and the common electrode wiring 97 are between the potential of the low potential power wiring VSS and the potential of the high potential power wiring VDD.

Here, the data line driving circuit signal wiring 92, the scan line driving circuit signal wiring 95, the video signal line 96, and the common electrode wiring 97 are an example of a "signal wiring" in the invention and are referred to below as the signal wiring SL.

As shown in FIG. 3A and FIG. 3B, the static electricity protection circuit 300 is arranged between the external circuit connection terminal 102 and the semiconductor circuits (the data line driving circuit 101, the sampling circuit 7, and the scan line driving circuit 104). The static electricity protection circuit 300 is arranged in each of the low potential power wiring VSS, the high potential power wiring VDD, and the signal wiring SL.

Detailed description will be given below; however, the static electricity protection circuit 300 is electrically connected with the low potential power wiring VSS, the high potential power wiring VDD, and the signal wiring SL. For example, the static electricity protection circuit 300 which is arranged in the low potential power wiring VSS in the diagram is also electrically connected with the high potential power wiring VDD and the signal wiring SL (omitted from the diagram). The static electricity protection circuit 300 which is arranged in the high potential power wiring VDD in the diagram is also electrically connected to the low potential power wiring VSS and the signal wiring SL (omitted from the diagram). The static electricity protection circuit 300 which is arranged in the signal wiring SL in the diagram is also electrically connected with the low potential power wiring VSS and the high potential power wiring VDD (omitted from the diagram).

[Configuration of Pixels]

Figure 4:
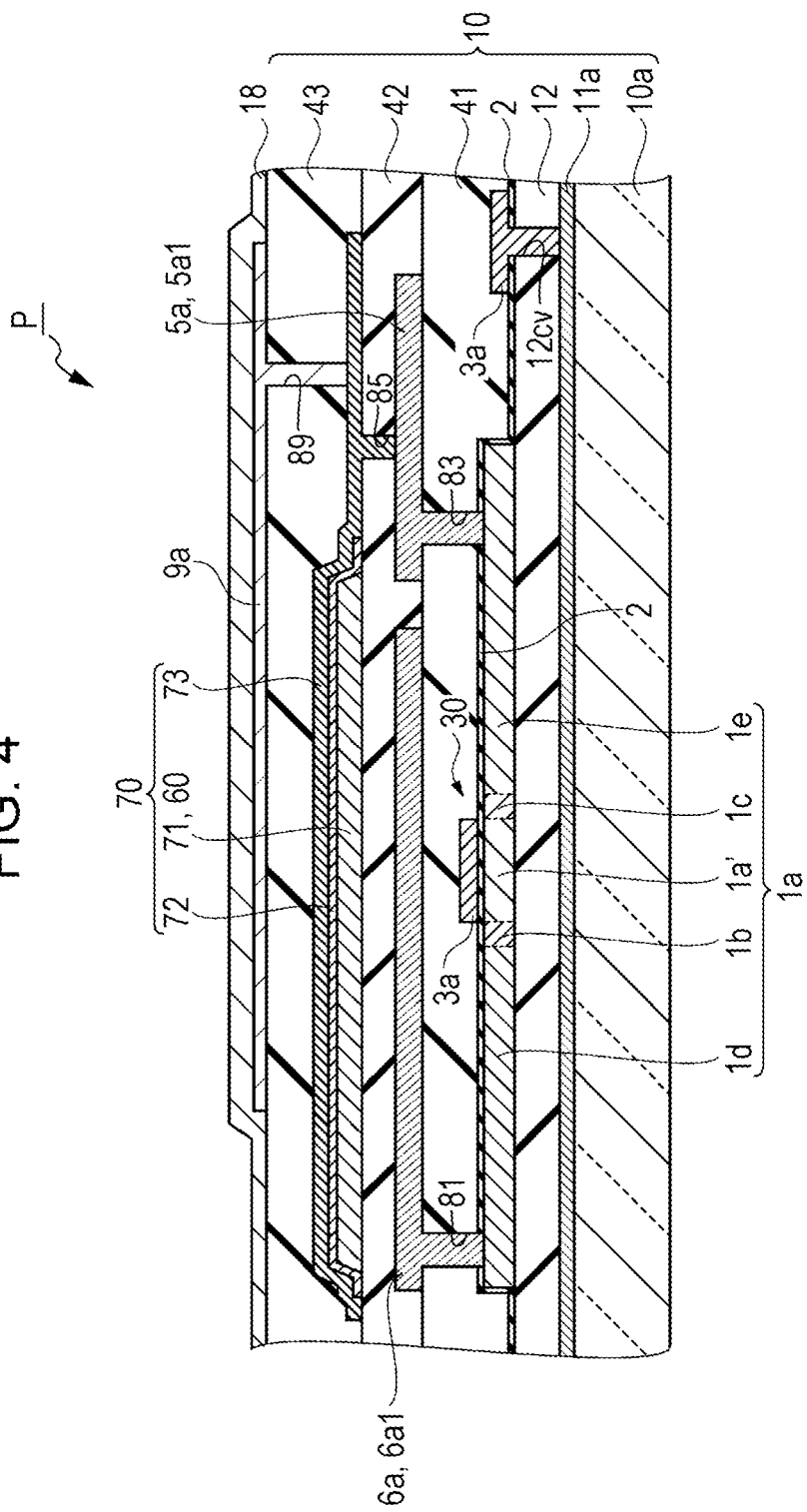
FIG. 4 is a schematic cross-sectional diagram which illustrates a positional relationship of each of the constituent elements which configure pixels.

FIG. 4 is a schematic cross-sectional diagram which illustrates a positional relationship of each of the constituent elements which configure the pixels and is expressed by a scale which is able to clearly show the relationship therebetween. Next, description will be given of a specific configuration of the pixel P with reference to FIG. 4.

As shown in FIG. 4, the pixel P has a first layer which includes the scan line 11a and the like, a second layer which includes the TFT 30 and the like, a third layer which includes the data line 6a and the like, a fourth layer which includes the additional capacitor 70 and the like, and a fifth layer (the highest layer) which includes the pixel electrode 9a, the oriented film 18, and the like, which are laminated in order on the substrate body 10a. A base insulating film 12 is provided between the first layer and the second layer, a first interlayer insulating film 41 is provided between the second layer and the third layer, a second interlayer insulating film 42 is provided between the third layer and the fourth layer, a third interlayer insulating film 43 is provided between the fourth layer and the fifth layer, and these prevent each of the elements described above from short-circuiting.

[Configuration of First Layer —Scan Line and the Like—]

The scan line 11a which is formed of tungsten silicide is provided in the first layer. It is possible to use, for example, titanium nitride, tungsten, and the like other than tungsten silicide as the material which configures the scan line 11a. The scan line 11a has a light shielding property, shields light which would otherwise be incident on the TFT 30 from the lower side, and suppresses erroneous operation of the TFT 30 due to light.

[Configuration of Second Layer —TFT and the Like—]

Next, the TFT 30 which includes the gate electrode 3a is provided as the second layer. The TFT 30 is configured by the gate electrode 3a which is formed of conductive polycrystalline silicon and tungsten silicide, a semiconductor layer 1a which is formed of polycrystalline silicon, and a gate insulating film 2 which is formed of silicon oxide which insulates the gate electrode 3a and the semiconductor layer 1a. The semiconductor layer 1a has a high concentration source region 1d, a channel region 1a', a high concentration drain region 1e, a bond region (a low concentration source region 1b) which is formed between the high concentration source region 1d and the channel region 1a', and a bond region (a low concentration drain region 1c) between the channel region 1a' and the high concentration drain region 1e. The gate insulating film 2 is provided to cover the semiconductor layer 1a and the base insulating film 12. In addition, the gate electrode 3a is arranged to be opposed to the channel region 1a' of the semiconductor layer 1a interposing the gate insulating film 2.

[Configuration between First Layer and Second Layer —Base Insulating Film and the Like—]

The base insulating film 12 which is formed of silicon oxide is provided between the scan line 11a and the semiconductor layer 1a. The base insulating film 12 is covered by the gate insulating film 2 in a region which does not come into contact with the semiconductor layer 1a. A contact hole 12cv is provided in the base insulating film 12 and the gate insulating film 2 on the scan line 11a. The gate electrode 3a is provided to fill the contact hole 12cv and the gate electrode 3a and the scan line 11a are connected with each other via the contact hole 12cv and have the same potential.

[Configuration of Third Layer —Data Lines and the Like—]

The data line 6a (a source electrode 6a1) and a relay electrode 5a (a drain electrode 5a1) are provided in the third layer. The data line 6a and the relay electrode 5a are configured of a conductive material such as metal and have a two-layer structure of, for example, a layer which is formed of aluminum and a layer which is formed of titanium nitride. The data line 6a and the source electrode 6a1 are integrally formed and the portion which comes into contact with the high concentration source region 1d of the TFT 30 is the source electrode 6a1. The relay electrode 5a and the drain electrode 5a1 are integrally formed and the portion which comes into contact with the high concentration drain region 1e of the TFT 30 is the drain electrode 5a1.

[Configuration between Second Layer and Third Layer —First Interlayer Insulating Film—]

The first interlayer insulating film 41 which is formed, for example, of silicon oxide or silicon nitride is provided between the gate electrode 3a and the data line 6a. A contact hole 81 for electrically connecting the high concentration source region 1d of the TFT 30 and the source electrode 6a1 and a contact hole 83 for electrically connecting the high concentration drain region 1e of the TFT 30 and the drain electrode 5a1 are provided in the first interlayer insulating film 41.

[Configuration of Fourth Layer —Additional Capacitor and the Like—]

The additional capacitor 70 is provided in the fourth layer. The additional capacitor 70 is configured by the upper electrode 73 as a pixel potential side capacitor electrode which is connected with the pixel electrode 9a, the lower electrode 71 as a fixed potential side capacitor electrode, a dielectric layer 72 which is interposed between the upper electrode 73 and the lower electrode 71, and the like. According to the additional capacitor 70, it is possible to remarkably increase the potential holding characteristic in the pixel electrode 9a.

The upper electrode 73 is configured of, for example, a conductive material such as metal and has a function of relaying and connecting the pixel electrode 9a and the relay electrode 5a. The upper electrode 73 is connected with the pixel electrode 9a via a contact hole 89 and is connected with the high concentration drain region 1e of the TFT 30 via a contact hole 85, the relay electrode 5a, and the contact hole 83.

The lower electrode 71 is configured of, for example, a conductive material such as metal and has a two-layer structure of, for example, a layer which is formed of aluminum and a layer which is formed of titanium nitride. The main line section of the lower electrode 71 extends in the arrangement direction of the scan line 11a and is the capacitor line 60. In other words, the lower electrode 71 and the capacitor line 60 have the same potential (a fixed potential).

As the dielectric layer 72, it is possible to use a single layer film such as silicon nitride, silicon oxide, hafnium oxide, aluminum oxide, and tantalum oxide, or a multilayer film where at least two or more types of single layer films out of these single layer films are laminated.

[Configuration between Third Layer and Fourth Layer —Second Interlayer Insulating Film—]

A second interlayer insulating film 42 which is configured of, for example, silicon nitride or silicon oxide is provided between the data line 6a and the relay electrode 5a on one hand, and the additional capacitor 70 on the other. A contact hole 85 for electrically connecting the relay electrode 5a and the upper electrode 73 is provided in the second interlayer insulating film 42.

[Configuration of Fifth Layer and Between Fourth Layer and Fifth Layer —Pixel Electrode and the Like—]

The pixel electrode 9a is provided in the fifth layer. The pixel electrode 9a is formed in an island pattern for each of the pixels P and the oriented film 18 is provided on the pixel electrode 9a. Then, a third interlayer insulating film 43 formed of, for example, silicon nitride, silicon oxide, or the like is provided between the pixel electrode 9a and the additional capacitor 70. A contact hole 89 for electrically connecting the pixel electrode 9a and the upper electrode 73 is provided in the third interlayer insulating film 43.

Here, the semiconductor circuits described above (the data line driving circuit 101, the sampling circuit 7, the scan line driving circuit 104, and the like) and the static electricity protection circuit 300 have the same wiring layer structure as the pixel P described above and are formed in the same process (at the same opportunity) as the pixel P.

[Summary of Static Electricity Protection Circuit]

Figure 5:
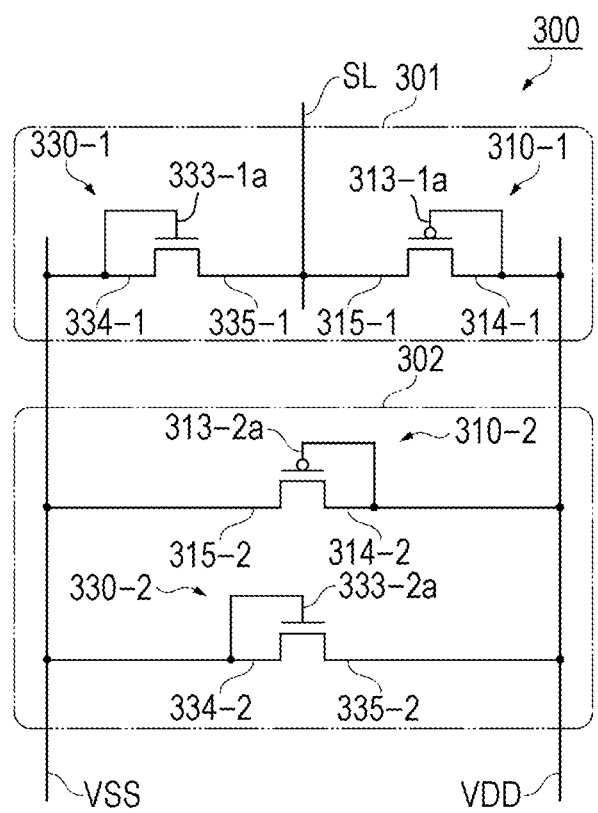
FIG. 5 is a circuit diagram of a static electricity protection circuit.

FIG. 5 is a circuit diagram of a static electricity protection circuit. Below, description will be given of a summary of the static electricity protection circuit 300 according to the present embodiment with reference to FIG. 5.

As shown in FIG. 5, the static electricity protection circuit 300 is provided with a first static electricity protection circuit 301 and a second static electricity protection circuit 302. Furthermore, the first static electricity protection circuit 301 is provided with a first p-type transistor 310-1 and a first n-type transistor 330-1. The second static electricity protection circuit 302 is provided with a second p-type transistor 310-2 and a second n-type transistor 330-2.

The first p-type transistor 310-1 and the first n-type transistor 330-1 which configure the first static electricity protection circuit 301 are electrically connected with the low potential power wiring VSS, the high potential power wiring VDD, and the signal wiring SL. In detail, the first p-type transistor 310-1 is electrically connected with the signal wiring SL and the high potential power wiring VDD. The first n-type transistor 330-1 is electrically connected with the low potential power wiring VSS and the signal wiring SL.

The second p-type transistor 310-2 and the second n-type transistor 330-2 which configure the second static electricity protection circuit 302 are electrically connected with the low potential power wiring VSS and the high potential power wiring VDD.

In the n-type transistors 330-1 and 330-2, the low potential sides are sources and the high potential sides are drains. In the description below, in the sources and the drains of the n-type transistors 330-1 and 330-2, the sides which are electrically connected with the low potential power wiring VSS are referred to as sources 334-1 and 334-2. In the sources and the drains of the n-type transistors 330-1 and 330-2, the sides which are not electrically connected with the low potential power wiring VSS are referred to as drains 335-1 and 335-2.

In the p-type transistors 310-1 and 310-2, the high potential sides are sources and the low potential sides are drains. In the description below, in the sources and the drains of the p-type transistors 310-1 and 310-2, the sides which are electrically connected with the high potential power wiring VDD are referred to as sources 314-1 and 314-2. In the sources and the drains of the p-type transistors 310-1 and 310-2, the sides which are not electrically connected with the high potential power wiring VDD are referred to as drains 315-1 and 315-2.

In the n-type transistors 330-1 and 330-2, the sources 334-1 and 334-2 are connected with gates 333-1a and 333-2a and the sources 334-1 and 334-2 and the gates 333-1a and 333-2a have the same potential. In the n-type transistors 330-1 and 330-2, the resistance changes according to the potential of the gates 333-1a and 333-2a with respect to the drains 335-1 and 335-2. That is, when the gates 333-1a and 333-2a have a positive potential with respect to the drains 335-1 and 335-2, the n-type transistors 330-1 and 330-2 are in a conductive state (the ON state). When the gates 333-1a and 333-2a have a negative potential with respect to the drains 335-1 and 335-2, the n-type transistors 330-1 and 330-2 are in a non-conductive state (the OFF state).

Here, the sources 334-1 and 334-2 of the n-type transistors 330-1 and 330-2 are an example of "one out of the source or the drain" in the invention.

In the p-type transistors 310-1 and 310-2, the sources 314-1 and 314-2 are connected with gates 313-1a and 313-2a and the sources 314-1 and 314-2 and the gates 313-1a and 313-2a have the same potential. In the p-type transistors 310-1 and 310-2, the resistance changes according to the potential of the gates 313-1a and 313-2a with respect to the drains 315-1 and 315-2. That is, when the gates 313-1a and 313-2a have a negative potential with respect to the drains 315-1 and 315-2, the p-type transistors 310-1 and 310-2 are in a conductive state (the ON state). When the gates 313-1a and 313-2a have a positive potential with respect to the drains 315-1 and 315-2, the p-type transistors 310-1 and 310-2 are in a non-conductive state (the OFF state).

Here, the sources 314-1 and 314-2 of the p-type transistors 310-1 and 310-2 are an example of "one out of the source or the drain" in the invention.

The gate 333-1a (the source 334-1) of the first n-type transistor 330-1 is electrically connected with the low potential power wiring VSS. The drain 335-1 of the first n-type transistor 330-1 is electrically connected with the signal wiring SL.

Here, the drain 335-1 of the first n-type transistor 330-1 is an example of "the other out of the source or the drain" in the invention.

The gate 313-1a (the source 314-1) of the first p-type transistor 310-1 is electrically connected with the high potential power wiring VDD. The drain 315-1 of the first p-type transistor 310-1 is electrically connected with the signal wiring SL.

Here, the drain 315-1 of the first p-type transistor 310-1 is an example of "the other out of the source or the drain" in the invention.

The gate 333-2a (the source 334-2) of the second n-type transistor 330-2 is electrically connected with the low potential power wiring VSS. The drain 335-2 of the second n-type transistor 330-2 is electrically connected with the high potential power wiring VDD.

Here, the drain 335-2 of the second p-type transistor 330-2 is an example of "the other out of the source or the drain" in the invention.

The gate 313-2a (the source 314-2) of the second p-type transistor 310-2 is electrically connected with the high potential power wiring VDD. The drain 315-2 of the second p-type transistor 310-2 is electrically connected with the low potential power wiring VSS.

Here, the drain 315-2 of the second p-type transistor 310-2 is an example of "the other out of the source or the drain" in the invention.

[Configuration of Static Electricity Protection Circuit]

Figure 6:
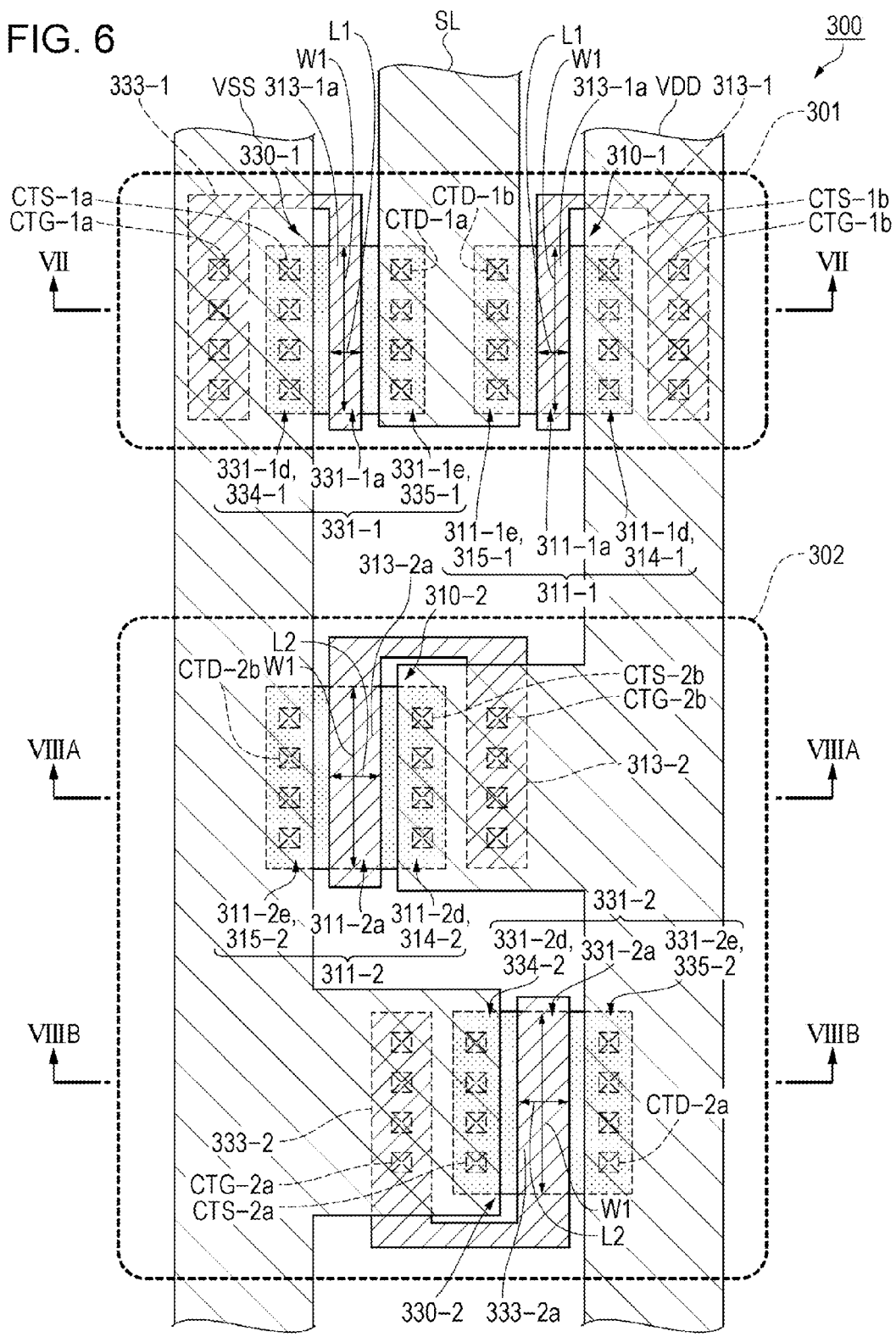
FIG. 6 is a schematic planar diagram which illustrates an arrangement of each of the configurations of the static electricity protection circuit.
Figure 7:
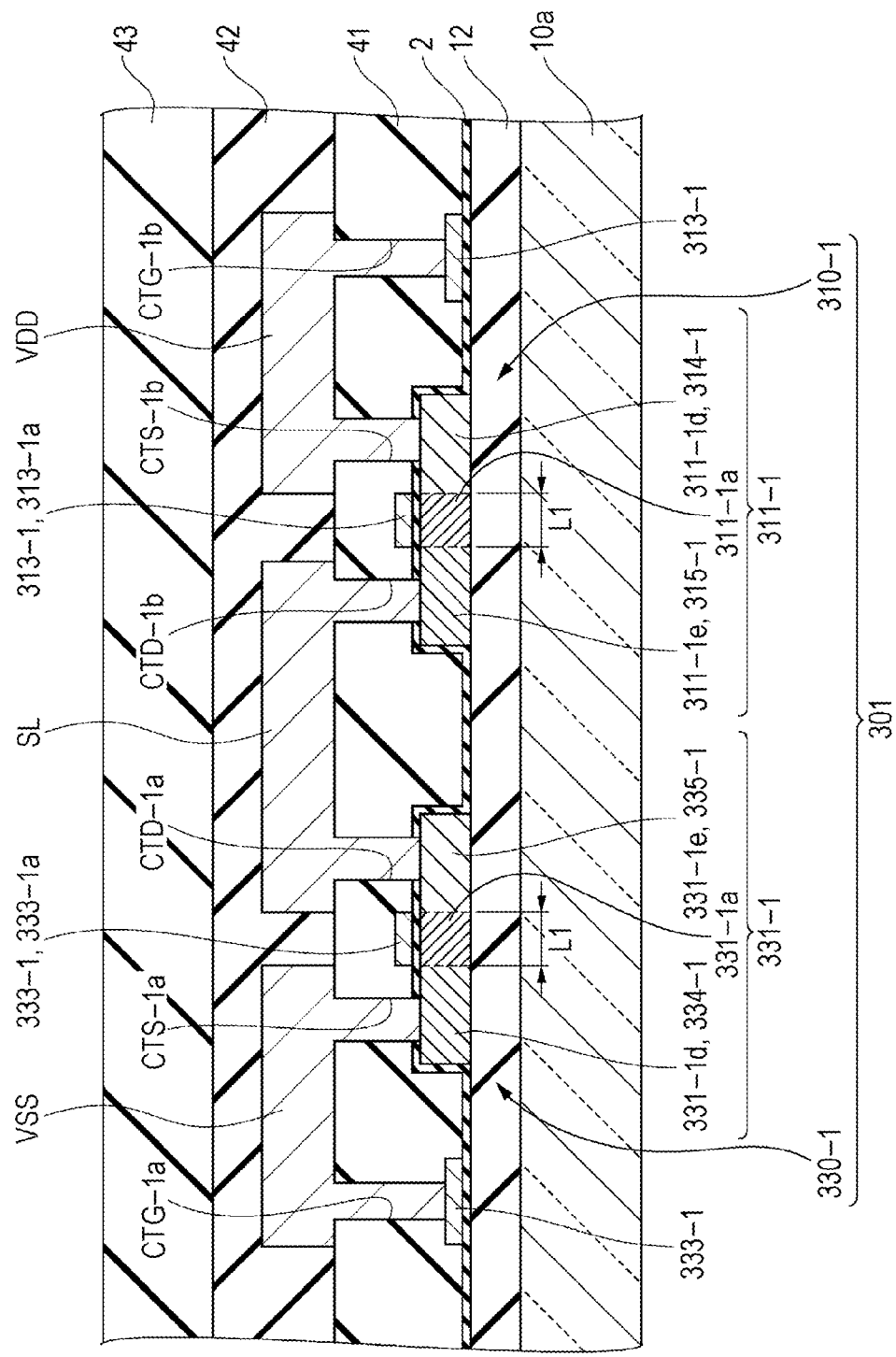
FIG. 7 is a schematic cross-sectional diagram which illustrates a structure of a first static electricity protection circuit taken along a line VII-VII in FIG. 6.
Figure 8A:
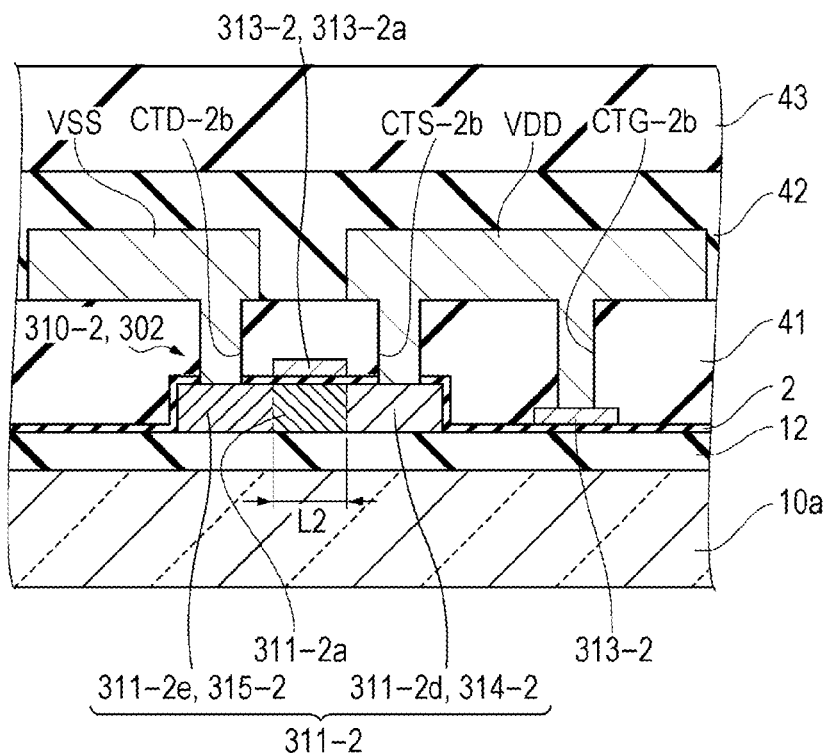
FIG. 8A is a schematic cross-sectional diagram which illustrates a structure of a second static electricity protection circuit taken along a line VIIIA-VIIIA in FIG. 6.
Figure 8B:
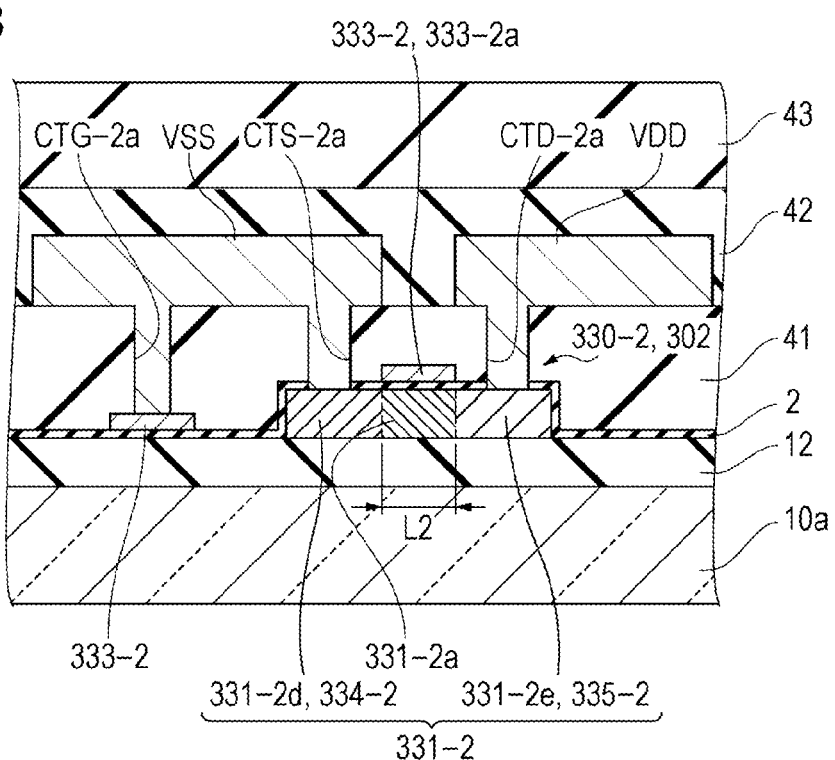
FIG. 8B is a schematic cross-sectional diagram which illustrates a structure of a second static electricity protection circuit taken along a line VIIIB-VIIIB in FIG. 6.

FIG. 6 is a schematic planar diagram which illustrates an arrangement of each of the configurations of the static electricity protection circuit. FIG. 7 is a schematic cross-sectional diagram which illustrates a structure of a first static electricity protection circuit taken along the line VII-VII in FIG. 6. FIG. 8A is a schematic cross-sectional diagram which illustrates a structure of a second static electricity protection circuit taken along the line VIIIA-VIIIA in FIG. 6 (a region where the second p-type transistor is formed). FIG. 8B is a schematic cross-sectional diagram which illustrates a structure of a second static electricity protection circuit taken along the line VIIIB-VIIIB in FIG. 6 (a region where the second n-type transistor is formed).

Firstly, description will be given of a planar configuration of the static electricity protection circuit 300 with reference to FIG. 6.

As shown in FIG. 6, the static electricity protection circuit 300 is configured by the first static electricity protection circuit 301 and the second static electricity protection circuit 302. The first n-type transistor 330-1 and the first p-type transistor 310-1 are arranged in line symmetry in the first static electricity protection circuit 301 to interpose the signal wiring SL. The second n-type transistor 330-2 and the second p-type transistor 310-2 are arranged in the second static electricity protection circuit 302 along the low potential power wiring VSS and the high potential power wiring VDD.

Figure 16:
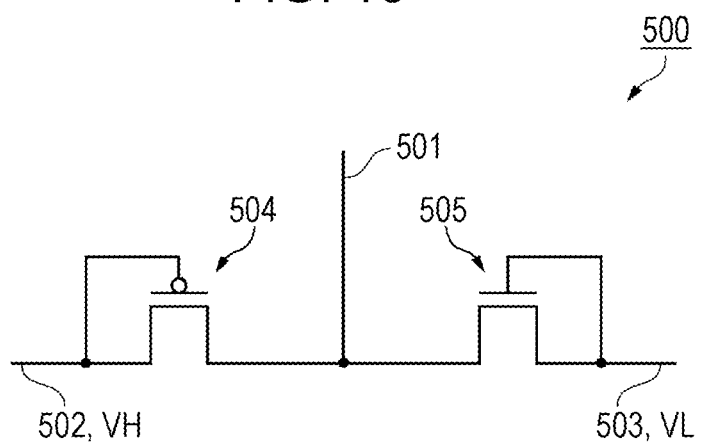
FIG. 16 is a circuit diagram of a static electricity protection circuit according to a technique known in the art.

Here, the first static electricity protection circuit 301 has the same configuration as the static electricity protection circuit 500 (FIG. 16) in the technique (JP-A-2006-18165) known in the art and the second static electricity protection circuit 302 has a configuration different from the static electricity protection circuit 500 in the technique known in the art.

In the first n-type transistor 330-1 of the first static electricity protection circuit 301, a semiconductor layer 331-1 has a rectangular shape and has a high concentration drain region 331-1e, a channel region 331-1a, and a high concentration source region 331-1d. A channel of the first n-type transistor 330-1 is formed in a region where the semiconductor layer 331-1 (the channel region 331-1a) and the gate electrode 333-1 (the gate 333-1a) overlap. The channel width of the first n-type transistor 330-1 is VII and the channel length is L1.

A part of the high concentration source region 331-1d overlaps with the low potential power wiring VSS and a contact hole CTS-1a is arranged in the overlapped portion. A part of the high concentration drain region 331-1e overlaps with the signal wiring SL and a contact hole CTD-1a is arranged in the overlapped portion. The gate electrode 333-1 is arranged to overlap with the channel region 331-1a of the semiconductor layer 331-1 and the low potential power wiring VSS. The gate electrode 333-1 in the portion which overlaps with the channel region 331-1a of the semiconductor layer 331-1 is the gate 333-1a. The gate electrode 333-1 has a U shape and does not overlap with the high concentration source region 331-1d. A contact hole CTG-1a is arranged in a portion where the gate electrode 333-1 and the low potential power wiring VSS overlap.

In the first p-type transistor 310-1 of the first static electricity protection circuit 301, a semiconductor layer 311-1 has a rectangular shape and has a high concentration drain region 311-1e, a channel region 311-1a, and a high concentration source region 311-1d. A channel of the first p-type transistor 310-1 is formed in a region where the semiconductor layer 311-1 (the channel region 311-1a) and the gate electrode 313-1 (the gate 313-1a) overlap. The channel width of the first p-type transistor 310-1 is W1 and the channel length is L1.

A part of the high concentration drain region 311-1e overlaps with the signal wiring SL and a contact hole CTD-1b is arranged in the overlapped portion. A part of the high concentration source region 311-1d overlaps with the high potential power wiring VDD and a contact hole CTS-1b is arranged in the overlapped portion. The gate electrode 313-1 is arranged to overlap with the channel region 311-1a of the semiconductor layer 311-1 and the high potential power wiring VDD. The gate electrode 313-1 in the portion which overlaps with the channel region 311-1a of the semiconductor layer 311-1 is the gate 313-1a. The gate electrode 313-1 has a U shape and does not overlap with the high concentration source region 311-1d. A contact hole CTG-1b is arranged in the portion where the gate electrode 313-1 and the high potential power wiring VDD overlap.

In the second n-type transistor 330-2 of the second static electricity protection circuit 302, the semiconductor layer 331-2 has a rectangular shape and has a high concentration drain region 331-2e, a channel region 331-2a, and a high concentration source region 331-2d. A channel of the second n-type transistor 330-2 is formed in the region where the semiconductor layer 331-2 (the channel region 331-2a) and the gate electrode 333-2 (the gate 333-2a) overlap. The channel width of the second n-type transistor 330-2 is W1 and the channel length is L2.

The second n-type transistor 330-2 and the first n-type transistor 330-1 have the same channel width W1. The channel length L2 of the second n-type transistor 330-2 is longer than the channel length L1 of the first n-type transistor 330-1. In detail, the channel length L2 of the second n-type transistor 330-2 is 120% of the channel length L1 of the first n-type transistor 330-1 or is longer than 120% of the channel length L1 of the first n-type transistor 330-1. When the channel widths are the same, the resistance value of the n-type transistor increases (is a higher resistance) in proportion to the channel length. Accordingly, the second n-type transistor 330-2 has a higher resistance than the first n-type transistor 330-1.

A part of the high concentration drain region 331-2e of the second n-type transistor 330-2 overlaps with the high potential power wiring VDD and a contact hole CTD-2a is arranged in the overlapped portion. A part of the high concentration source region 331-2d overlaps with the low potential power wiring VSS and a contact hole CTS-2a is arranged in the overlapped portion. The gate electrode 333-2 is arranged to overlap with the channel region 331-2a of the semiconductor layer 331-2 and the low potential power wiring VSS. The gate electrode 333-2 in the portion which overlaps with the channel region 331-2a of the semiconductor layer 331-2 is the gate 333-2a. The low potential power wiring VSS protrudes to the side of the semiconductor layer 331-2 to have a portion which overlaps with the high concentration source region 331-2d of the semiconductor layer 331-2 and the gate electrode 333-2 in planar view. A contact hole CTG-2a is arranged in a portion where the low potential power wiring VSS and the gate electrode 333-2 overlap.

In the second p-type transistor 310-2 of the second static electricity protection circuit 302, the semiconductor layer 311-2 has a rectangular shape and has a high concentration drain region 311-2e, a channel region 311-2a, and a high concentration source region 311-2d. A channel of the second p-type transistor 310-2 is formed in a region where the semiconductor layer 311-2 (the channel region 311-2a) and the gate electrode 313-2 (the gate 313-2a) overlap. The channel width of the second p-type transistor 310-2 is W1 and the channel length is L2.

The second p-type transistor 310-2 and the first p-type transistor 310-1 have the same channel width W1. The channel length L2 of the second p-type transistor 310-2 is longer than the channel length L1 of the first p-type transistor 310-1. In detail, the channel length L2 of the second p-type transistor 310-2 is 120% of the channel length L1 of the first p-type transistor 310-1 or is longer than 120% of the channel length L1 of the first p-type transistor 310-1. When the channel widths are the same, the resistance value of the p-type transistor increases (is a higher resistance) in proportion to the channel length. Accordingly, the second p-type transistor 310-2 has a higher resistance than the first p-type transistor 310-1.

A part of the high concentration drain region 311-2e overlaps with the low potential power wiring VSS and a contact hole CTD-2b is arranged in the overlapped portion. A part of the high concentration source region 311-2d overlaps with the high potential power wiring VDD and a contact hole CTS-2b is arranged in the overlapped portion. The gate electrode 313-2 is arranged to overlap with the channel region 311-2a of the semiconductor layer 311-2 and the high potential power wiring VDD. The gate electrode 313-2 in the portion which overlaps with the channel region 311-2a of the semiconductor layer 311-2 is the gate 313-2a. The high potential power wiring VDD protrudes to the side of the semiconductor layer 311-2 to have a portion which overlaps the high concentration source region 311-2d of the semiconductor layer 311-2 and the gate electrode 313-2 in planar view. A contact hole CTG-2*b* is arranged in a portion where the high potential power wiring VDD and the gate electrode 313-2 overlap.

As described above, the second n-type transistor 330-2 has a higher resistance than the first n-type transistor 330-1. The second p-type transistor 310-2 has a higher resistance than the first p-type transistor 310-1.

Accordingly, the second static electricity protection circuit 302 has a higher resistance than the first static electricity protection circuit 301.

Here, the first n-type transistor 330-1, the first p-type transistor 310-1, the second n-type transistor 330-2, and the second p-type transistor 310-2 have equal channel widths W1, but are not limited thereto. For example, the n-type transistors 330-1 and 330-2 or the p-type transistors 310-1 and 310-2 may have a configuration where the channel widths or the channel lengths are different from each other.

In brief, the channel width and the channel length of each of the transistors may be set such that the resistance value of the second n-type transistor 330-2 is higher than the resistance value of the first n-type transistor 330-1. In the same manner, it is sufficient if the channel width and the channel length of each of the transistors are set such that the resistance value of the second p-type transistor 310-2 is higher than the resistance value of the first p-type transistor 310-1.

In other words, the channel lengths or the channel widths of the transistors which configure the second static electricity protection circuit 302 and the first static electricity protection circuit 301 may be set such that the second static electricity protection circuit 302 has a higher resistance than the first static electricity protection circuit 301.

Next, description will be given of the structure of the first static electricity protection circuit 301 with reference to FIG. 7.

As shown in FIG. 7, the semiconductor layers 311-1 and 331-1 which are provided on the base insulating film 12 which covers the substrate body 10*a* is covered by the gate insulating film 2. The gate electrodes 313-1 and 333-1 which are formed in the same process as the gate electrode 3*a* are provided on the gate insulating film 2. The gate electrodes 313-1 and 333-1 in the portion which is arranged to be opposed to the semiconductor layers 311-1 and 331-1 via the gate insulating film 2 are the gates 313-1*a* and 333-1*a*. The gate electrodes 313-1 and 333-1 and the gate insulating film 2 are covered by the first interlayer insulating film 41. The low potential power wiring VSS, the high potential power wiring VDD, and the signal wiring SL which are formed in the same process as the data line 6*a* or the relay electrode 5*a* are provided on the first interlayer insulating film 41. The second interlayer insulating film 42 and the third interlayer insulating film 43 are laminated in order in the low potential power wiring VSS, the high potential power wiring VDD, and the signal wiring SL.

Next, description will be given of the structure in a region where the second p-type transistor 310-2 is provided in the second static electricity protection circuit 302 with reference to FIG. 8A.

As shown in FIG. 8A, the semiconductor layer 311-2 which is provided on the base insulating film 12 which covers the substrate body 10*a* is covered by the gate insulating film 2. The gate electrode 313-2 which is formed in the same process as the gate electrode 3*a* is provided on the gate insulating film 2. The gate electrode 313-2 in the portion which is arranged to be opposed to the semiconductor layer 311-2 via the gate insulating film 2 is the gate 313-2*a*. The gate electrode 313-2 and the gate insulating film 2 are covered by the first interlayer insulating film 41. The low potential power wiring VSS and the high potential power wiring VDD which are formed in the same process as the data line 6*a* or the relay electrode 5*a* are provided on the first interlayer insulating film 41. The second interlayer insulating film 42 and the third interlayer insulating film 43 are laminated in order in the low potential power wiring VSS and the high potential power wiring VDD.

Next, description will be given of the structure in a region where the second n-type transistor 330-2 is provided in the second static electricity protection circuit 302 with reference to FIG. 8B.

As shown in FIG. 8B, the semiconductor layer 331-2 which is provided on the base insulating film 12 which covers the substrate body 10*a* is covered by the gate insulating film 2. The gate electrode 333-2 which is formed in the same process as the gate electrode 3*a* is provided on the gate insulating film 2. The gate electrode 333-2 in the portion which is arranged to be opposed to the semiconductor layer 331-2 via the gate insulating film 2 is the gate 333-2*a*. The gate electrode 333-2 and the gate insulating film 2 are covered by the first interlayer insulating film 41. The low potential power wiring VSS and the high potential power wiring VDD which are formed in the same process as the data line 6*a* or the relay electrode 5*a* are provided on the first interlayer insulating film 41. The second interlayer insulating film 42 and the third interlayer insulating film 43 are laminated in order in the low potential power wiring VSS and the high potential power wiring VDD.

Here, the low potential power wiring VSS, the high potential power wiring VDD, and the signal wiring SL are configured by a main line section which is electrically connected with the semiconductor circuits (the data line driving circuit 101, the scan line driving circuit 104, the sampling circuit 7, and the like) and a branch line section which is electrically connected with the static electricity protection circuit 300 (omitted from the diagram). For example, in a case where a branch line section which is electrically connected with one static electricity protection circuit 300 out of a plurality of the static electricity protection circuits 300 intersects in planar view with another branch line section which is electrically connected with another static electricity protection circuit 300 out of a plurality of the static electricity protection circuits 300, a portion which corresponds to the branch line section of the low potential power wiring VSS, the high potential power wiring VDD, and the signal wiring SL has a multilayer wiring structure which is formed in the same process as the pixel P (omitted from the diagram) such that neither the branch line section nor the other branch line section electrically short-circuits. In the same manner, a portion which corresponds to the mainline section of the low potential power wiring VSS, the high potential power wiring VDD, and the signal wiring SL also has a multilayer wiring structure which is formed in the same process as the pixel P (omitted from the diagram).

Furthermore, the low potential power wiring VSS in the first n-type transistor 330-1 is a relay electrode which electrically connects the gate 333-1*a* (the gate electrode 333-1) and the source 334-1 (the high concentration source region 331-1*d*) and the high potential power wiring VDD in the first p-type transistor 310-1 is a relay electrode which electrically connects the gate 313-1*a* (the gate electrode 313-1) and the source 314-1 (the high concentration source region 311-1*d*) (refer to FIG. 7). The low potential power wiring VSS in the second n-type transistor 330-2 is a relay electrode which electrically connects the gate 333-2*a* (the gate electrode 333-2) and the source 334-2 (the high concentration source region 331-2d) (refer to FIG. 8B). The high potential power wiring VDD in the second p-type transistor 310-2 is a relay electrode which electrically connects the gate 313-2a (the gate electrode 313-2) and the source 314-2 (the high concentration source region 311-2d) (refer to FIG. 8A).

[Operation and Effects of Static Electricity Protection Circuit]

FIG. 9A to FIG. 11B are circuit diagrams of the static electricity protection circuit which corresponds to FIG. 5 and the flow of electrical charges which are applied due to static electricity is illustrated with a dashed line. In detail, the flow of the negative electrical charge NC which is applied to the low potential power wiring VSS is illustrated with a dashed line in FIG. 9A. The flow of the negative electrical charge NC which is applied to the high potential power wiring VDD is illustrated with a dashed line in FIG. 9B. The flow of the positive electrical charge PC which is applied to the low potential power wiring VSS is illustrated with a dashed line in FIG. 10A.

Figure 10A:
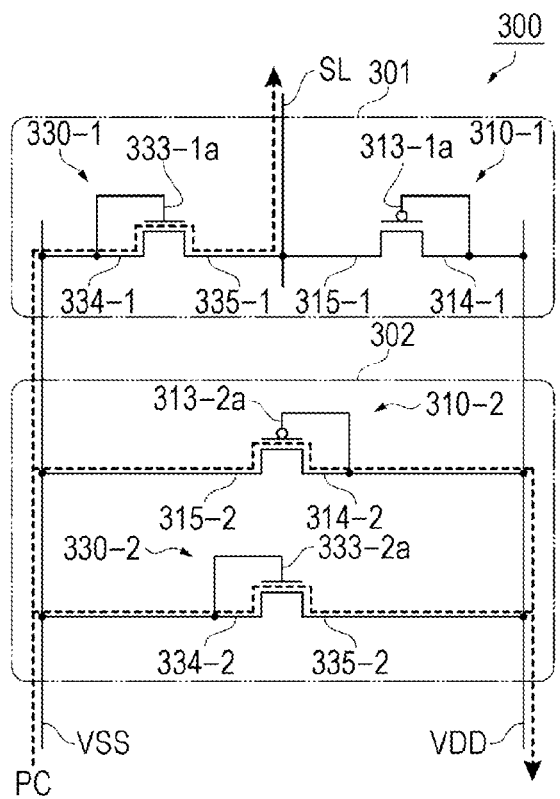
FIG. 10A is a circuit diagram which illustrates a flow of a positive electrical charge PC which is applied to the low potential power wiring VSS.
Figure 10B:
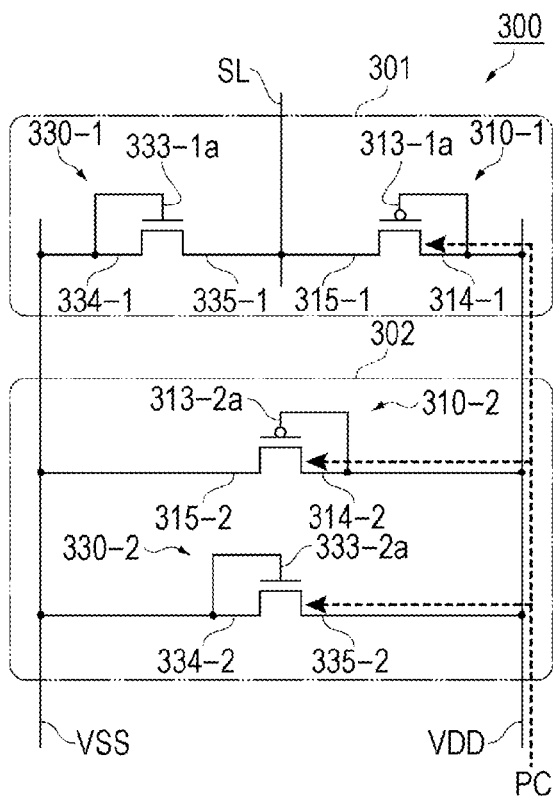
FIG. 10B is a circuit diagram which illustrates a flow of a positive electrical charge PC which is applied to the high potential power wiring VDD.

The flow of the positive electrical charge PC which is applied to the high potential power wiring VDD is illustrated with a dashed line in FIG. 10B. The flow of the negative electrical charge NC which is applied to the signal wiring SL is illustrated with a dashed line in FIG. 11A. The flow of the positive electrical charge PC which is applied to the signal wiring SL is illustrated with a dashed line in FIG. 11B.

During the operation of the liquid crystal apparatus 100, the potentials of each of the wirings are increasingly high in order of the potential of the low potential power wiring VSS, the potential of the signal wiring SL, and the potential of the high potential power wiring VDD.

As a result, in the first n-type transistor 330-1, the first n-type transistor 330-1 is in a non-conductive state since the gate 333-1a has a negative potential with respect to the drain 335-1. In the first p-type transistor 310-1, the first p-type transistor 310-1 is in a non-conductive state since the gate 313-1a has a positive potential with respect to the drain 315-1. In the second n-type transistor 330-2, the second n-type transistor 330-2 is in a non-conductive state since the gate 333-2a has a negative potential with respect to the drain 335-2. In the second p-type transistor 310-2, the second p-type transistor 310-2 is in a non-conductive state since the gate 313-2a has a positive potential with respect to the drain 315-2.

In other words, during the operation of the liquid crystal apparatus 100, the transistors which configure the first static electricity protection circuit 301 and the second static electricity protection circuit 302 are all in a non-conductive state. For this reason, the liquid crystal apparatus 100 operates normally without the low potential power wiring VSS, the high potential power wiring VDD, and the signal wiring SL, which are electrically connected with the transistors which configure the first static electricity protection circuit 301 and the second static electricity protection circuit 302, electrically interfering with one another.

During non-operation of the liquid crystal apparatus 100, the low potential power wiring VSS, the high potential power wiring VDD, and the signal wiring SL are in a floating state where the potentials are not determined. For example, the low potential power wiring VSS has a positive potential when positive static electricity acts on the low potential power wiring VSS, and the low potential power wiring VSS has a negative potential when negative static electricity acts on the low potential power wiring VSS. In the same manner, the potentials of the high potential power wiring VDD and the signal wiring SL also change according to the static electricity which acts on the high potential power wiring VDD and the signal wiring SL.

During non-operation of the liquid crystal apparatus 100, when static electricity acts on the wirings (the low potential power wiring VSS, the high potential power wiring VDD, and the signal wiring SL), the potentials of the wirings change significantly and there is a concern that the semiconductor circuits (the sampling circuit 7, the data line driving circuit 101, and the scan line driving circuit 104) which are electrically connected with the wirings will suffer irreparable electrostatic damage (for example, electrostatic breakdown). Since the liquid crystal apparatus 100 is provided with the static electricity protection circuit 300, the influence of static electricity during non-operation of the liquid crystal apparatus 100 is small (suppressed) and it is difficult for the semiconductor circuits (the sampling circuit 7, the data line driving circuit 101, and the scan line driving circuit 104) to suffer irreparable electrostatic damage (for example, electrostatic breakdown).

As described above, the static electricity protection circuit 300 according to the present embodiment has the first static electricity protection circuit 301 with the same configuration as the static electricity protection circuit 500 (refer to FIG. 16) in the technique known in the art and the second static electricity protection circuit 302 with the configuration different from the static electricity protection circuit 500 in the technique known in the art. Accordingly, the static electricity protection circuit 300 according to the present embodiment is able to more strongly suppress the influence of static electricity compared to a case where only the static electricity protection circuit 500 according to the technique known in the art is provided.

Description will be given of the details below. In the description below, a static electricity protection circuit which is configured by only the first static electricity protection circuit 301, that is, the static electricity protection circuit 300 which is not provided with the second static electricity protection circuit 302 is referred to as the static electricity protection circuit in the technique known in the art.

During non-operation of the liquid crystal apparatus 100, when a negative electrical charge NC is applied to the low potential power wiring VSS due to static electricity, the gate 333-1a of the first n-type transistor 330-1 has a negative potential with respect to the drain 335-1 and the first n-type transistor 330-1 is in a non-conductive state. The gate 333-2a of the second n-type transistor 330-2 has a negative potential with respect to the drain 335-2 and the second n-type transistor 330-2 is in a non-conductive state. The gate 313-2a of the second p-type transistor 310-2 has a positive potential with respect to the drain 315-2 and the second p-type transistor 310-2 is in a non-conductive state.

Figure 9A:
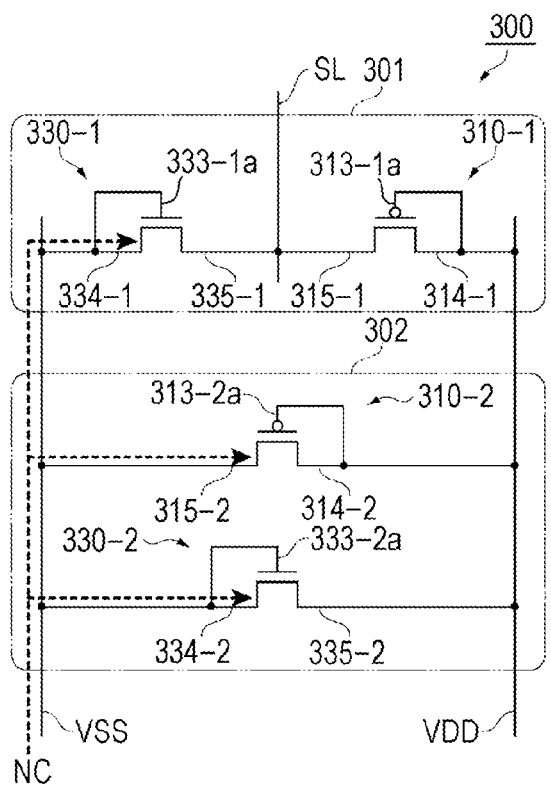
FIG. 9A is a circuit diagram which illustrates a flow of a negative electrical charge NC which is applied to a low potential power wiring VSS.

For this reason, as shown in FIG. 9A, the negative electrical charge NC which is applied to the low potential power wiring VSS due to static electricity is dispersed to and acts on the three transistors which are the first n-type transistor 330-1, the second n-type transistor 330-2, and the second p-type transistor 310-2. In a case of using the static electricity protection circuit in the technique known in the art, the negative electrical charge NC described above acts locally on only the first n-type transistor 330-1. When the negative electrical charge NC acts locally on only the first n-type transistor 330-1, it is easy for the first n-type transistor 330-1 to suffer irreparable electrostatic damage (for example, electrostatic breakdown) compared to a case of the negative electrical charge NC being dispersed and acting on the three transistors. In other words, since the influence of the negative electrical charge NC which is applied to the low potential power wiring VSS due to static electricity is dispersed to the three transistors in the static electricity protection circuit 300 according to the present embodiment, it is difficult for the first n-type transistor 330-1, the second n-type transistor 330-2, and the second p-type transistor 310-2 to suffer irreparable electrostatic damage compared to a case of using the static electricity protection circuit in the technique known in the art. Thus, due to the negative electrical charge NC which is applied to the low potential power wiring VSS due to static electricity, it is possible to make the first static electricity protection circuit 301 and the second static electricity protection circuit 302 difficult to break, to operate the first static electricity protection circuit 301 and the second static electricity protection circuit 302 for a long time in a stable manner, and to suppress the influence of static electricity in a stable manner.

When the negative electrical charge NC is applied to the high potential power wiring VDD due to static electricity, the gate 333-2a of the second n-type transistor 330-2 has a positive potential with respect to the drain 335-2 and the second n-type transistor 330-2 is in a conductive state. The gate 313-1a of the first p-type transistor 310-1 has a negative potential with respect to the drain 315-1 and the first p-type transistor 310-1 is in a conductive state. The gate 313-2a of the second p-type transistor 310-2 has a negative potential with respect to the drain 315-2 and the second p-type transistor 310-2 is in a conductive state.

Figure 9B:
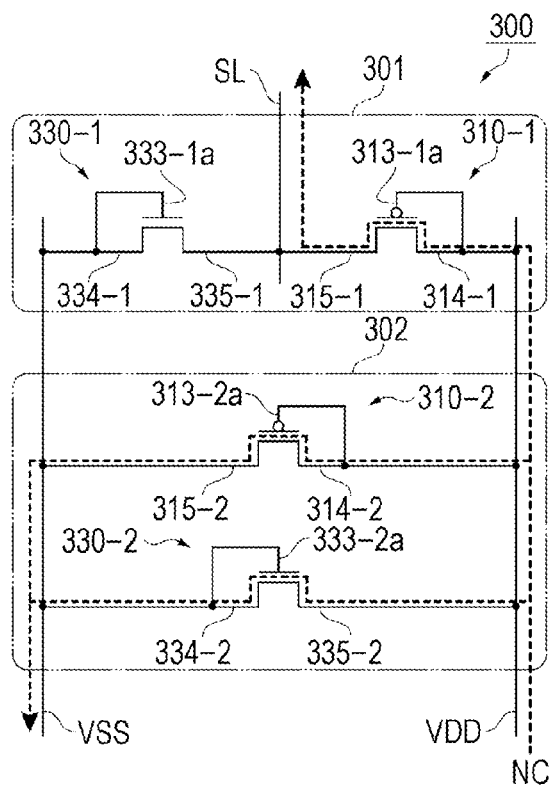
FIG. 9B is a circuit diagram which illustrates a flow of a negative electrical charge NC which is applied to a high potential power wiring VDD.

For this reason, as shown in FIG. 9B, the negative electrical charge NC which is applied to the high potential power wiring VDD due to static electricity is discharged to the signal wiring SL via the first p-type transistor 310-1 which is in a conductive state and is further discharged to the low potential power wiring VSS via the second n-type transistor 330-2 and the second p-type transistor 310-2 which are in a conductive state. In a case of using the static electricity protection circuit of the technique known in the art, the negative electrical charge NC described above is only discharged to the signal wiring SL. Since the negative electrical charge NC which is applied to the high potential power wiring VDD is discharged to both the signal wiring SL and the low potential power wiring VSS in the static electricity protection circuit 300, changes in potential in the high potential power wiring VDD due to the negative electrical charge NC are strongly suppressed compared to a case of using the static electricity protection circuit in the technique known in the art and it is difficult for the semiconductor circuits (the sampling circuit 7, the data line driving circuit 101, and the scan line driving circuit 104) which are electrically connected with the high potential power wiring VDD to suffer irreparable electrostatic damage.

Here, although details will be given below, when the negative electrical charge NC which is applied to the high potential power wiring VDD is only discharged to the signal wiring SL, the changes in potential in the signal wiring SL are large and there is a concern that the semiconductor circuits (the sampling circuit 7, the data line driving circuit 101, and the scan line driving circuit 104) and the like which are connected with the signal wiring SL will suffer irreparable electrostatic damage. In the present embodiment, since the negative electrical charge NC which is applied to the high potential power wiring VDD is dispersed and discharged to both the signal wiring SL and the low potential power wiring VSS, the changes in potential in the wirings (the low potential power wiring VSS and the signal wiring SL) on the side where the negative electrical charge NC is discharged are small compared to a case of discharging to only the signal wiring SL and it is difficult for the semiconductor circuits (the sampling circuit 7, the data line driving circuit 101, and the scan line driving circuit 104) and the like to suffer irreparable electrostatic damage.

When the positive electrical charge PC is applied to the low potential power wiring VSS due to static electricity, the gate 333-1a of the first n-type transistor 330-1 has a positive potential with respect to the drain 335-1 and the first n-type transistor 330-1 is in a conductive state. The gate 333-2a of the second n-type transistor 330-2 has a positive potential with respect to the drain 335-2 and the second n-type transistor 330-2 is in a conductive state. The gate 313-2a of the second p-type transistor 310-2 has a negative potential with respect to the drain 315-2 and the second p-type transistor 310-2 is in a conductive state.

For this reason, as shown in FIG. 10A, the positive electrical charge PC which is applied to the low potential power wiring VSS due to static electricity is discharged to the signal wiring SL via the first n-type transistor 330-1 which is in a conductive state and is further discharged to the high potential power wiring VDD via the second n-type transistor 330-2 and the second p-type transistor 310-2 which are in a conductive state. In a case of using the static electricity protection circuit in the technique known in the art, the positive electrical charge PC described above is only discharged to the signal wiring SL. In the static electricity protection circuit 300, since the positive electrical charge PC which is applied to the low potential power wiring VSS is discharged to both the signal wiring SL and the high potential power wiring VDD, the changes in potential in the low potential power wiring VSS due to the positive static electricity (the positive electrical charge PC) are strongly suppressed compared to a case of using the static electricity protection circuit in the technique known in the art and it is difficult for the semiconductor circuits (the sampling circuit 7, the data line driving circuit 101, and the scan line driving circuit 104) which are electrically connected with the low potential power wiring VSS to suffer irreparable electrostatic damage.

Here, although the details will be given below, when the positive electrical charge PC which is applied to the low potential power wiring VSS is discharged to only the signal wiring SL, the changes in potential in the signal wiring SL are large and there is a concern that the semiconductor circuits (the sampling circuit 7, the data line driving circuit 101, and the scan line driving circuit 104) and the like which are connected with the signal wiring SL will suffer irreparable electrostatic damage. In the present embodiment, since the positive electrical charge PC which is applied to the low potential power wiring VSS is dispersed and discharged to both the signal wiring SL and the high potential power wiring VDD, the changes in potential in the wirings (the high potential power wiring VDD and the signal wiring SL) on the side where the positive electrical charge PC is discharged are small compared to a case of only discharging to the signal wiring SL and it is difficult for the semiconductor circuits (the sampling circuit 7, the data line driving circuit 101, and the scan line driving circuit 104) and the like to suffer irreparable electrostatic damage.

When the positive electrical charge PC is applied to the high potential power wiring VDD due to static electricity, the gate 313-1a of the first p-type transistor 310-1 has a positive potential with respect to the drain 315-1 and the first p-type transistor 310-1 is in a non-conductive state. The gate 333-2a of the second n-type transistor 330-2 has a negative potential with respect to the drain 335-2 and the second n-type transistor 330-2 is in a non-conductive state. The gate 313-2a of the second p-type transistor 310-2 has a positive potential with respect to the drain 315-2 and the second p-type transistor 310-2 is in a non-conductive state.

For this reason, as shown in FIG. 10B, the positive electrical charge PC which is applied to the high potential power wiring VDD due to static electricity is dispersed to and acts on the three transistors which are the first p-type transistor 310-1, the second n-type transistor 330-2, and the second p-type transistor 310-2. In a case of using the static electricity protection circuit in the technique known in the art, the positive electrical charge PC described above acts locally on only the first p-type transistor 310-1. When the positive electrical charge PC acts locally on only the first p-type transistor 310-1, it is easy for the first p-type transistor 310-1 to suffer irreparable electrostatic damage compared to a case of the positive electrical charge PC being dispersed and acting on the three transistors. Since the influence of the positive electrical charge PC which is applied to the high potential power wiring VDD due to static electricity is dispersed to the three transistors in the static electricity protection circuit 300, it is difficult for the first p-type transistor 310-1, the second n-type transistor 330-2, and the second p-type transistor 310-2 to suffer irreparable electrostatic damage in a case of using the static electricity protection circuit in the technique known in the art.

Thus, due to the positive electrical charge PC which is applied to the high potential power wiring VDD due to static electricity, it is possible to make the first static electricity protection circuit 301 and the second static electricity protection circuit 302 difficult to break, to operate the first static electricity protection circuit 301 and the second static electricity protection circuit 302 for a long time in a stable manner, and to suppress the influence of static electricity in a stable manner.

When the negative electrical charge NC is applied to the signal wiring SL due to static electricity, the gate 333-1a of the first n-type transistor 330-1 has a positive potential with respect to the drain 335-1 and the first n-type transistor 330-1 is in a conductive state. The gate 313-1a of the first p-type transistor 310-1 has a positive potential with respect to the drain 315-1 and the first p-type transistor 310-1 is in a non-conductive state.

Figure 11A:
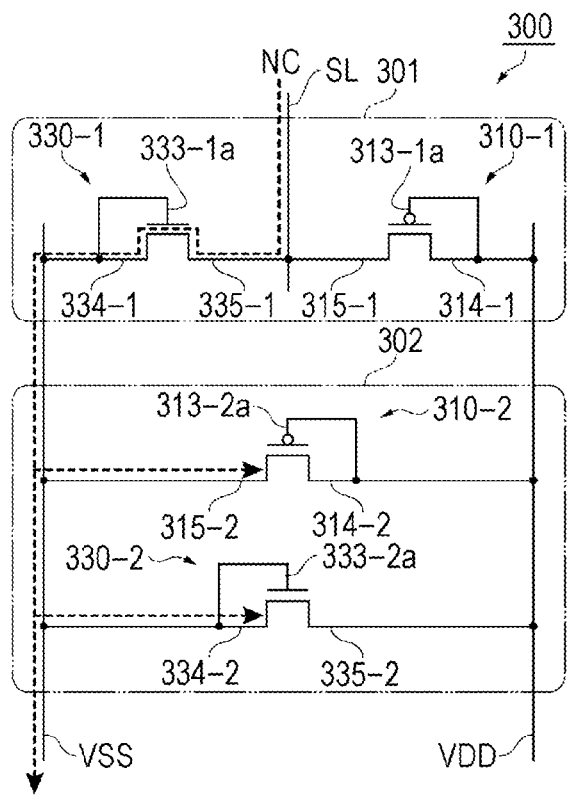
FIG. 11A is a circuit diagram which illustrates a flow of a negative electrical charge NC which is applied to a signal wiring SL.

For this reason, as shown in FIG. 11A, the negative electrical charge NC which is applied to the signal wiring SL due to static electricity is discharged to the low potential power wiring VSS via the first n-type transistor 330-1 which is in a conductive state. Thus, since the negative electrical charge NC which is applied to the signal wiring SL is discharged to the low potential power wiring VSS via the first n-type transistor 330-1 which is in a conductive state, changes in potential in the signal wiring SL due to the negative electrical charge NC are suppressed and it is difficult for the semiconductor circuits (the sampling circuit 7, the data line driving circuit 101, and the scan line driving circuit 104) and the like which are electrically connected with the signal wiring SL to suffer irreparable electrostatic damage (for example, electrostatic breakdown).

When the positive electrical charge PC is applied to the signal wiring SL due to static electricity, the gate 333-1a of the first n-type transistor 330-1 has a negative potential with respect to the drain 335-1 and the first n-type transistor 330-1 is in a non-conductive state. The gate 313-1a of the first p-type transistor 310-1 has a negative potential with respect to the drain 315-1 and the first p-type transistor 310-1 is in a conductive state.

Figure 11B:
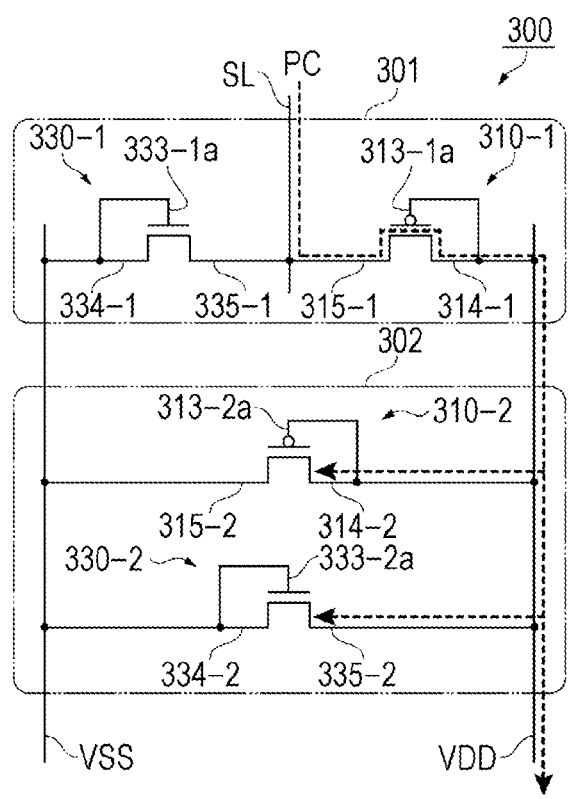
FIG. 11B is a circuit diagram which illustrates a flow of a positive electrical charge PC which is applied to the signal wiring SL.

For this reason, as shown in FIG. 11B, the positive electrical charge PC which is applied to the signal wiring SL due to static electricity is discharged to the high potential power wiring VDD via the first p-type transistor 310-1 which is in a conductive state. Since the positive electrical charge PC which is applied to the signal wiring SL is discharged to the high potential power wiring VDD via the first p-type transistor 310-1 which is in a conductive state, changes in potential in the signal wiring SL due to the positive electrical charge PC are suppressed and it is difficult for the semiconductor circuits (the sampling circuit 7, the data line driving circuit 101, and the scan line driving circuit 104) and the like which are electrically connected with the signal wiring SL to suffer irreparable electrostatic damage.

The low potential power wiring VSS and the high potential power wiring VDD are wirings which supply electrical power to the semiconductor circuits (the sampling circuit 7, the data line driving circuit 101, and the scan line driving circuit 104), the signal wiring SL is a wiring which supplies a signal which drives the liquid crystal apparatus 100, and large currents flow in the low potential power wiring VSS and the high potential power wiring VDD compared to the signal wiring SL. For this reason, the area of the low potential power wiring VSS and the high potential power wiring VDD is larger than the area of the signal wiring SL, that is, the wiring capacitance of the low potential power wiring VSS and the high potential power wiring VDD is larger than the wiring capacitance of the signal wiring SL, and it is easier for the low potential power wiring VSS and the high potential power wiring VDD to conduct large currents compared to the signal wiring SL.

Assuming a case where the same amount of electrical charges are applied due to static electricity to the low potential power wiring VSS, the high potential power wiring VDD, and the signal wiring SL, the signal wiring SL with a small area (wiring capacitance) has larger changes in potential compared to the low potential power wiring VSS and the high potential power wiring VDD with a large area (wiring capacitance). In addition, the low potential power wiring VSS and the high potential power wiring VDD with a large wiring capacitance have smaller changes in potential compared to the signal wiring SL with a small wiring capacitance. In this manner, the influence of static electricity is different in the low potential power wiring VSS, the high potential power wiring VDD, and the signal wiring SL.

As shown in FIG. 11A and FIG. 11B, the negative electrical charge NC or the positive electrical charge PC which is applied to the signal wiring SL due to static electricity is discharged to either the low potential power wiring VSS or the high potential power wiring VDD and the changes in potential in the signal wiring SL due to static electricity are reduced. Since the wirings (the low potential power wiring VSS and the high potential power wiring VDD) on the side where the electrical charge is discharged have a larger wiring capacitance compared to the wiring (the signal wiring SL) on the side where the electrical charge is applied, even when the electrical charge is discharged, the changes in potential in the wirings (the low potential power wiring VSS and the high potential power wiring VDD) on the side where the electrical charge is discharged are smaller than the changes in potential in the wiring (the signal wiring SL) on the side where the electrical charge is applied. Thus, in the same manner as the wiring (the signal wiring SL) on the side where the electrical charge is applied, defects due to static electricity (irreparable electrostatic damage) are also suppressed in the wirings (the low potential power wiring VSS and the high potential power wiring VDD) on the side where the electrical charge is discharged.

In this manner, it is more preferable for the wiring on the side where the electrical charge due to static electricity is discharged to be a wiring with a large wiring capacitance (the low potential power wiring VSS and the high potential power wiring VDD) than to be a wiring with a small wiring capacitance (the signal wiring SL).

As shown in FIG. 9B and FIG. 10A, the negative electrical charge NC or the positive electrical charge PC which is applied to the low potential power wiring VSS or the high potential power wiring VDD due to static electricity is dispersed and discharged to both the signal wiring SL and a power wiring (either of the low potential power wiring VSS or the high potential power wiring VDD) and changes in potential in the low potential power wiring VSS or the high potential power wiring VDD due to static electricity are reduced.

For example, in a case of using the static electricity protection circuit in the technique known in the art, the negative electrical charge NC or the positive electrical charge PC which is applied to the low potential power wiring VSS or the high potential power wiring VDD due to static electricity is discharged only to the signal wiring SL. In this case, since the wiring (the signal wiring SL) on the side where the electrical charge is discharged has a smaller wiring capacitance compared to the wirings (the low potential power wiring VSS and the high potential power wiring VDD) on the side where the electrical charge is applied, changes in potential in the wiring (the signal wiring SL) on the side where the electrical charge is discharged when the electric charge is discharged are larger than changes in potential in the wirings (the low potential power wiring VSS and the high potential power wiring VDD) on the side where the electrical charge is applied. That is, by discharging the negative electrical charge NC or the positive electrical charge PC which is applied to the low potential power wiring VSS or the high potential power wiring VDD due to static electricity only to the signal wiring SL, large changes in potential occur in the signal wiring SL and there is a concern that the semiconductor circuits (the sampling circuit 7, the data line driving circuit 101, and the scan line driving circuit 104) which are electrically connected with the signal wiring SL will suffer irreparable electrostatic damage.

In the static electricity protection circuit 300, the negative electrical charge NC or the positive electrical charge PC which is applied to the low potential power wiring VSS or the high potential power wiring VDD due to static electricity is dispersed and discharged to both the signal wiring SL and a power wiring (either of the low potential power wiring VSS or the high potential power wiring VDD). Thus, compared to a case of using the static electricity protection circuit in the technique known in the art, changes in potential in the wiring (the signal wiring SL) on the side where the electrical charge is discharged are small and it is difficult for the semiconductor circuits (the sampling circuit 7, the data line driving circuit 101, and the scan line driving circuit 104) which are electrically connected with the signal wiring SL to suffer irreparable electrostatic damage.

Furthermore, the ease of discharging the electrical charge which is applied due to static electricity is different according to the wiring capacitance of the wiring on the side where the electrical charge is discharged. In detail, it is easier to discharge the electrical charge which is applied due to static electricity in a case where the wiring capacitance of the wiring on the side where the electrical charge is discharged is large than in a case where the wiring capacitance of the wiring on the side where the electrical charge is discharged is small. Thus, it is possible to discharge the electrical charge which is applied due to static electricity more quickly in a case where the wiring capacitance of the wiring on the side where the electrical charge is discharged is large than in a case where the wiring capacitance of the wiring on the side where the electrical charge is discharged is small. When the electrical charge which is applied due to static electricity is discharged quickly, the changes in potential in the wiring on the side where static electricity is applied are also reduced.

In a case of using the static electricity protection circuit in the technique known in the art, the wiring on the side where the electrical charge is discharged is the signal wiring SL. In a case of using the static electricity protection circuit 300 according to the present embodiment, the wiring on the side where the electrical charge is discharged is the signal wiring SL and a power wiring (either of the low potential power wiring VSS or the high potential power wiring VDD). For this reason, the wiring capacitance of the wiring on the side where the electrical charge is discharged is larger in the static electricity protection circuit 300 than in the static electricity protection circuit in the technique known in the art. Thus, the static electricity protection circuit 300 can quickly discharge the electrical charge which is applied due to static electricity compared to the static electricity protection circuit in the technique known in the art and reduce changes in potential in the wiring on the side where static electricity is applied.

In this manner, since changes in potential in both the wiring on the side where static electricity is applied and the wiring on the side where static electricity is discharged are small in the static electricity protection circuit 300 according to the present embodiment, it is possible to more strongly suppress defects due to static electricity (irreparable electrostatic damage) compared to the static electricity protection circuit in the technique known in the art.

Static electricity is generated due to various factors in the process of manufacturing the liquid crystal apparatus 100. For example, plasma is a source of static electricity in processes which use a plasma atmosphere (cleaning, film formation, etching, and the like). Static electricity is generated by sliding, friction, or the like during transport or handling. Charged members (cassettes, jigs, tools, and the like) are also sources of static electricity. Furthermore, static electricity is generated due to various factors even after the liquid crystal apparatus 100 is completed.

It is easier for the static electricity to act on the low potential power wiring VSS and the high potential power wiring VDD with a large area than on the signal wiring SL with a small area. That is, it is easier for a large amount of electrical charge due to static electricity to be applied to the low potential power wiring VSS and the high potential power wiring VDD with a large area compared to the signal wiring SL with a small area. As shown in FIG. 9B or FIG. 10A, a large amount of electrical charge which is applied to the low potential power wiring VSS or the high potential power wiring VDD is discharged to the signal wiring SL via the first static electricity protection circuit 301 which is in a conductive state and also discharged to a power wiring (either of the low potential power wiring VSS or the high potential power wiring VDD) via the second static electricity protection circuit 302 which is in a conductive state.

As described above, since there is a relationship where it is easier for the electrical charge which is applied due to static electricity to flow in the side of the wiring with a large wiring capacitance than in the side of the wiring with a small wiring capacitance, it is easier for the electrical charge which is applied due to static electricity to flow in the side of the second static electricity protection circuit 302 than in the side of the first static electricity protection circuit 301. Furthermore, since it is easy for a large amount of electrical charge to be applied to the low potential power wiring VSS and the high potential power wiring VDD due to static electricity, it is easy for a large amount of electrical charge (referred to below as a discharge current) to flow in the second static electricity protection circuit 302.

Assuming a case where the first static electricity protection circuit 301 and the second static electricity protection circuit 302 have substantially the same resistance, a large discharge current flows in the second static electricity protection circuit 302. The current value of the discharge current which flows in the second static electricity protection circuit 302 is in proportion to the amount of the electrical charge which is applied to the low potential power wiring VSS and the high potential power wiring VDD due to the static electricity. For this reason, when the amount of the electrical charge which is applied to the low potential power wiring VSS and the high potential power wiring VDD is large, there is a concern that an excessive discharge current will flow so as to break the second static electricity protection circuit 302.

As described above, since the second static electricity protection circuit 302 has a higher resistance than the first static electricity protection circuit 301, it is possible to suppress excessive discharge current which would otherwise break the second static electricity protection circuit 302. That is, by the second static electricity protection circuit 302 having a higher resistance than the first static electricity protection circuit 301, the resistance of the second static electricity protection circuit 302 (the static electricity protection circuit 300) with respect to static electricity is increased and the second static electricity protection circuit 302 (the static electricity protection circuit 300) is able to operate in a stable manner for a long time.

In order for the second static electricity protection circuit 302 to have a higher resistance than the first static electricity protection circuit 301, the channel length L2 of the second n-type transistor 330-2 is set to be longer than the channel length L1 of the first n-type transistor 330-1 and the channel length L2 of the second p-type transistor 310-2 is set to be longer than the channel length L2 of the first p-type transistor 310-1. For this reason, the capacitance, which is formed in a channel region, of the second n-type transistor 330-2 is larger than that of the first n-type transistor 330-1 and that of the second p-type transistor 310-2 is larger than that of the first p-type transistor 310-1. That is, the second n-type transistor 330-2 and the second p-type transistor 310-2 have larger capacitances than the first n-type transistor 330-1 and the first p-type transistor 310-1.

As described above, it is easy for a large current to flow in the low potential power wiring VSS and the high potential power wiring VDD. Furthermore, when a large current flows in the low potential power wiring VSS and the high potential power wiring VDD, the potential of the low potential power wiring VSS and the high potential power wiring VDD changes. In the present embodiment, since the second static electricity protection circuits 302 (the second n-type transistor 330-2 and the second p-type transistor 310-2) which have a large capacitance are electrically connected with the low potential power wiring VSS and the high potential power wiring VDD, the wiring capacitance of the low potential power wiring VSS and the high potential power wiring VDD is large and changes in potential in the low potential power wiring VSS and the high potential power wiring VDD are reduced even when a large current flows. Accordingly, the stability of the potential of the low potential power wiring VSS and the high potential power wiring VDD is increased and it is possible to operate the liquid crystal apparatus 100 in a stable manner.

That is, by configuring the second static electricity protection circuit 302 with a transistor with a capacitance which is larger than that of the first static electricity protection circuit 301 (configuring the second static electricity protection circuit 302 with a transistor which has a higher resistance than the first static electricity protection circuit 301), it is possible to achieve a new effect where it is possible to increase the wiring capacitance of the low potential power wiring VSS and the high potential power wiring VDD, increase the stability of the potential of the low potential power wiring VSS and the high potential power wiring VDD, and operate the liquid crystal apparatus 100 in a stable manner in addition to the effect that the influence of static electricity described above is suppressed.

As described above, it is possible to obtain the following effects in the present embodiment.

(1) The static electricity protection circuit 300 has the first static electricity protection circuit 301 which has the same configuration as the technique known in the art and a second static electricity protection circuit 302 which has a configuration different from the technique known in the art. Compared to a case of using the static electricity protection circuit in the technique known in the art, when the static electricity protection circuit 300 is used, it is possible to quickly discharge electrical charges due to static electricity from wirings (the low potential power wiring VSS and the high potential power wiring VDD) on the side where the electrical charge is applied due to static electricity, reduce changes in potential in the wiring on the side where the electrical charge is applied due to static electricity, and also further reduce changes in potential in the wiring on the side where the electrical charge is discharged due to static electricity. Accordingly, the static electricity protection circuit 300 can more strongly suppress the influence of static electricity with respect to the low potential power wiring VSS and the high potential power wiring VDD compared to the static electricity protection circuit in the technique known in the art and increase the resistance (the reliability) of the liquid crystal apparatus 100 with respect to static electricity.

(2) Since the second static electricity protection circuit 302 has a higher resistance than the first static electricity protection circuit 301, excessive discharge current which would otherwise break the second static electricity protection circuit 302 is suppressed, the resistance of the static electricity protection circuit 300 (the second static electricity protection circuit 302) with respect to static electricity is increased, and it is possible to operate the static electricity protection circuit 300 in a stable manner for a long time.

(3) Since a larger capacitance is formed in the second static electricity protection circuit 302 than the first static electricity protection circuit 301, by electrically connecting the second static electricity protection circuit 302 with the low potential power wiring VSS and the high potential power wiring VDD, the wiring capacitance of the low potential power wiring VSS and the high potential power wiring VDD is increased and it is possible to reduce changes in potential in the low potential power wiring VSS and the high potential power wiring VDD in a case where a large current flows. Accordingly, the stability of the potential of the low potential power wiring VSS and the high potential power wiring VDD is increased and it is possible to operate the liquid crystal apparatus 100 in a stable manner.

Embodiment 2

[Electronic Equipment]

Figure 12:
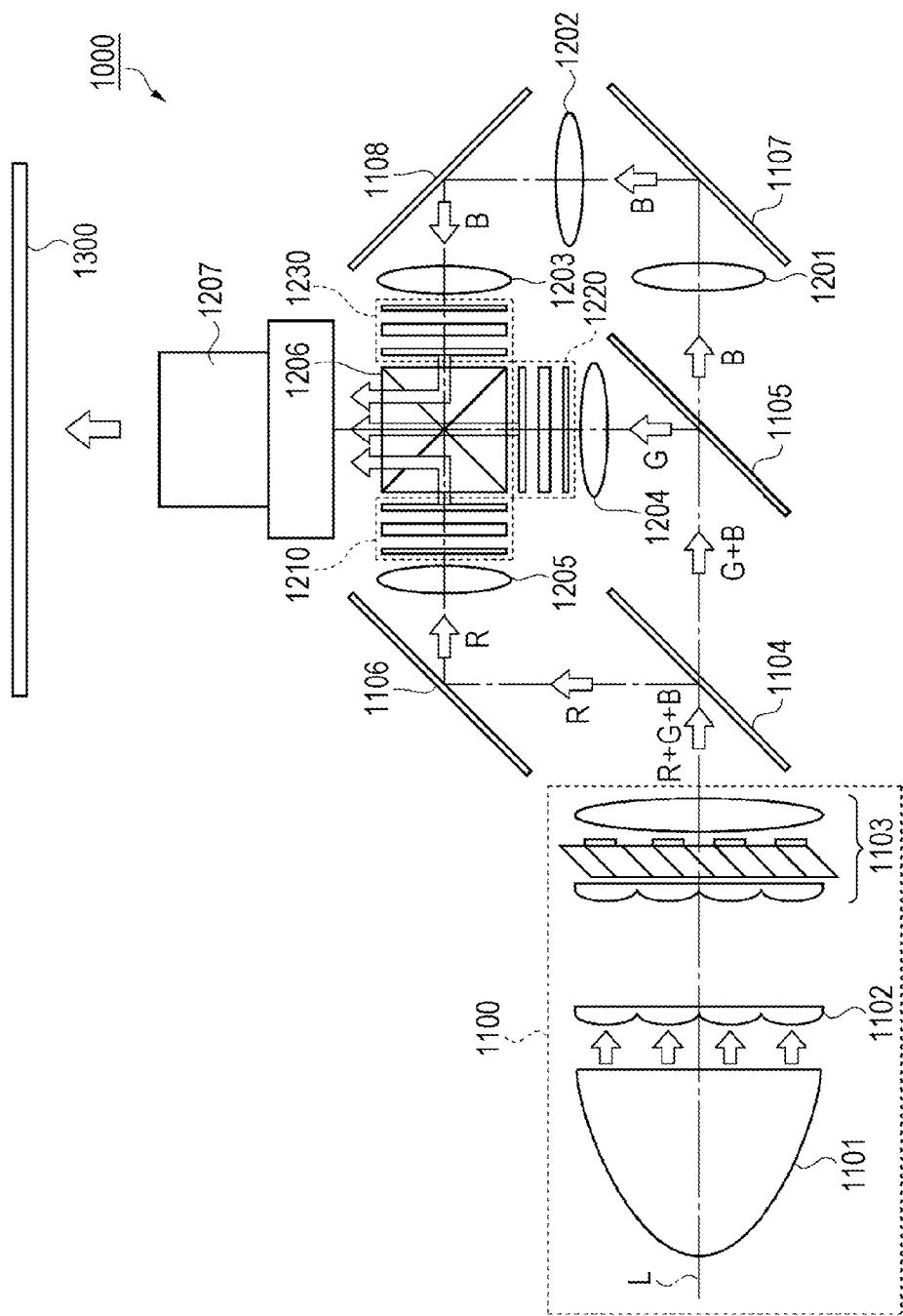
FIG. 12 is a schematic diagram which illustrates a configuration of a projection type display apparatus according to Embodiment 2.

FIG. 12 is a schematic diagram which illustrates a configuration of a projection type display apparatus (a liquid crystal projector) as electronic equipment. As shown in FIG. 12, a projection type display apparatus 1000 as the electronic equipment of the present embodiment is provided with a polarization lighting apparatus 1100 which is arranged along a system optical axis L, two dichroic mirrors 1104 and 1105 as light separation elements, three reflection mirrors 1106, 1107, and 1108, five relay lenses 1201, 1202, 1203, 1204, and 1205, three transmission type liquid crystal light valves 1210, 1220, and 1230 as optical modulation means, a cross dichroic prism 1206 as a photosynthesis element, and a projection lens 1207.

The polarization lighting apparatus 1100 is schematically configured by a lamp unit 1101 formed of a white light source such as an ultrahigh pressure mercury lamp or a halogen lamp as a light source, an integrator lens 1102, and a polarization conversion element 1103.

The dichroic mirror 1104 reflects red light (R) and transmits green light (G) and blue light (B) out of polarized light beams which are irradiated from the polarization lighting apparatus 1100. The other dichroic mirror 1105 reflects the green light (G) which is transmitted through the dichroic mirror 1104 and transmits the blue light (B).

The red light (R) which is reflected by the dichroic mirror 1104 is incident to a liquid crystal light valve 1210 via the relay lens 1205 after being reflected by the reflection mirror 1106.

The green light (G) which is reflected by the dichroic mirror 1105 is incident to a liquid crystal light valve 1220 via the relay lens 1204.

The blue light (B) which is transmitted through the dichroic mirror 1105 is incident to a liquid crystal light valve 1230 via an optical guiding system which is formed of three relay lenses 1201, 1202, and 1203 and two reflection mirrors 1107 and 1108.

The liquid crystal light valves 1210, 1220, and 1230 are each arranged to be opposed with respect to an incident surface for each of the colored lights of the cross dichroic prism 1206. The colored light which is incident to the liquid crystal light valves 1210, 1220, and 1230 is modulated based on video information (a video signal) and is irradiated toward the cross dichroic prism 1206. The prism is formed by four rectangular prisms being laminated and a dielectric multilayer film which reflects red light and a dielectric multilayer film which reflects blue light are formed in a cross shape in the inside. Three colored lights are synthesized by the dielectric multilayer films and light which expresses a color image is synthesized. The synthesized light is projected onto a screen 1300 by the projection lens 1207 which is a projection optical system and the image is enlarged and displayed.

The liquid crystal apparatus 100 described above is applied to the liquid crystal light valve 1210, 1220, and 1230. The liquid crystal apparatus 100 has the static electricity protection circuit 300 according to Embodiment 1 and it is difficult for the semiconductor circuits (the data line driving circuit 101, the sampling circuit 7, the scan line driving circuit 104, and the like) and the like to suffer irreparable electrostatic damage (for example, electrostatic breakdown). Accordingly, the projection type display apparatus 1000 where the liquid crystal apparatus 100 is applied is not easily influenced by static electricity and has high reliability.

The invention is not limited to the embodiment described above and is able to be appropriately changed within a range which does not deviate from the gist or concept of the invention which is read from the scope of the claims and specification as a whole, and liquid crystal apparatuses which have such changes and electronic equipment where the liquid crystal apparatus is applied are also included in the technical range of the invention.

Various Modification Examples may be considered other than the Embodiments described above. Below, description will be given using Modification Examples.

Modification Example 1

Figure 13:
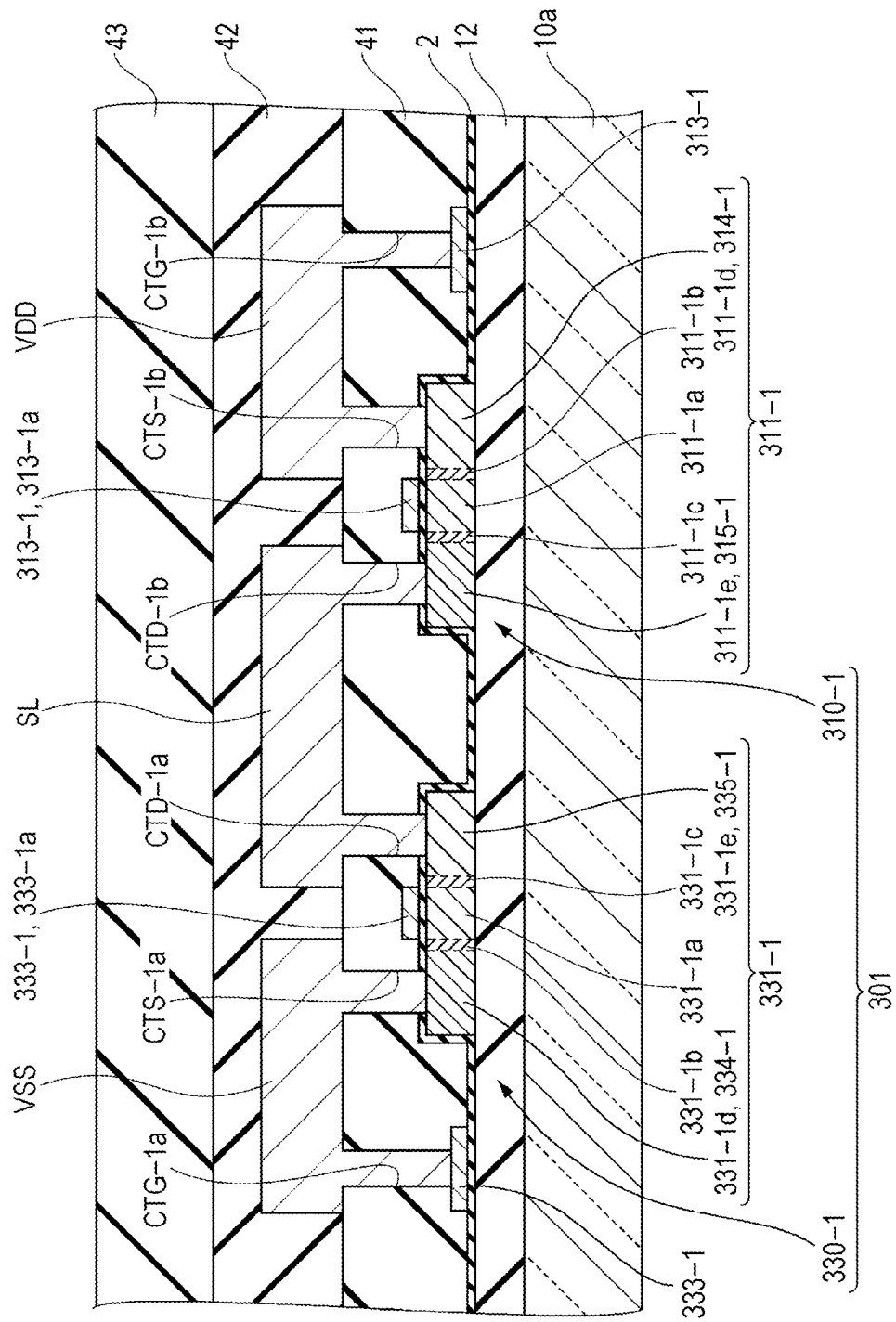
FIG. 13 is a schematic cross-sectional diagram which illustrates a structure of a first static electricity protection circuit according to Modification Example 1.
Figure 14A:
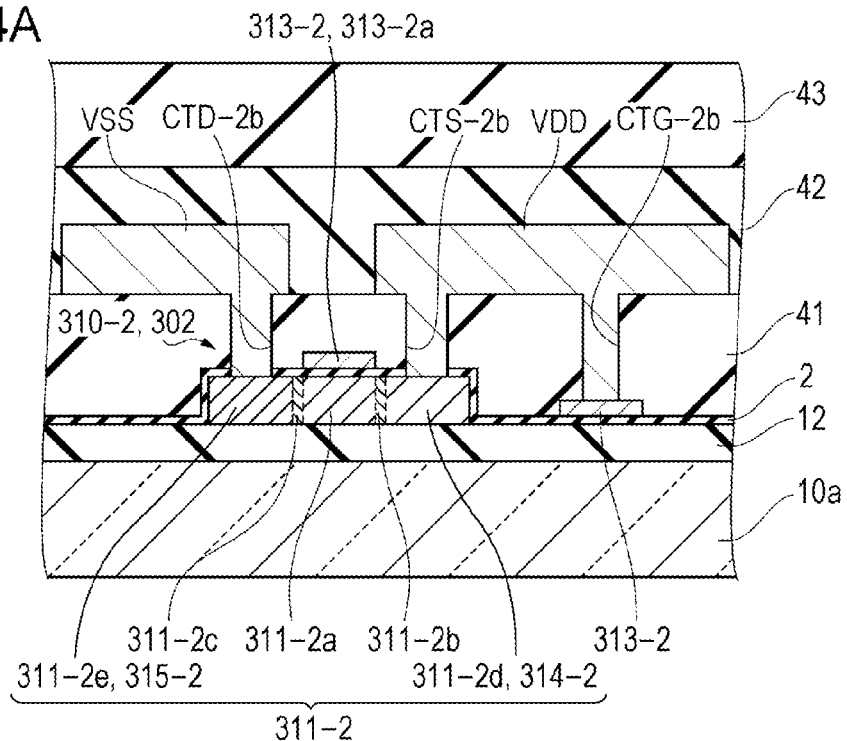
FIG. 14A is a schematic cross-sectional diagram which illustrates a structure of a second p-type transistor according to Modification Example 1.
Figure 14B:
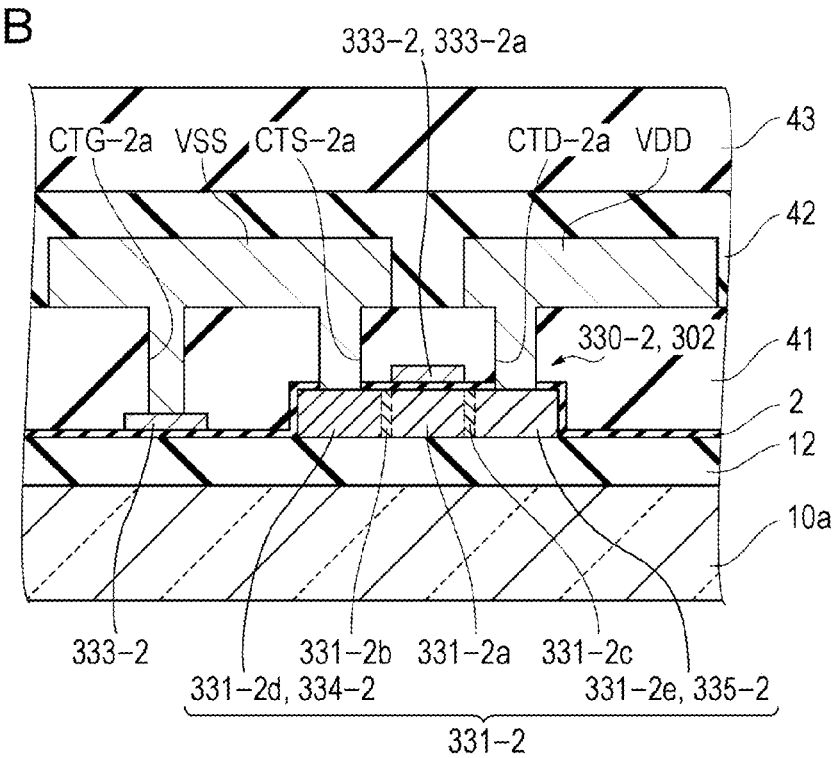
FIG. 14B is a schematic cross-sectional diagram of a second n-type transistor according to Modification Example 1.

FIG. 13 corresponds to FIG. 7 and is a schematic cross-sectional diagram which illustrates a structure of a first static electricity protection circuit (a first p-type transistor and a first n-type transistor). FIG. 14A corresponds to FIG. 8A and is a schematic cross-sectional diagram which illustrates a structure of the second p-type transistor. FIG. 14B corresponds to FIG. 8B and is a schematic cross-sectional diagram which illustrates a structure of the second n-type transistor. Here, the same reference numerals will be given to the same configuration as Embodiment 1 and detailed description thereof will be omitted.

The transistor which configures the static electricity protection circuit 300 according to the present Modification Example has an LDD (Lightly Doped Drain) structure where low concentration impurity regions (high resistance regions) are arranged at both sides of the channel region of the semiconductor layer. The transistor which configures the static electricity protection circuit 300 according to Embodiment 1 does not have such an LDD structure (a low concentration impurity region). This point is the point of difference between the present Modification Example and Embodiment 1.

In detail, as shown in FIG. 13, the semiconductor layer 311-1 of the first p-type transistor 310-1 according to the present Modification Example is configured by a high concentration drain region 311-1e, a low concentration drain region 311-1c, the channel region 311-1a, a low concentration source region 311-1b, and the high concentration source region 311-1d. In other words, the first p-type transistor 310-1 according to the Modification Example has an LDD structure where the low concentration impurity regions 311-1b and 311-1c (high resistance regions) are arranged at both sides of the channel region 311-1a of the semiconductor layer 311-1.

The semiconductor layer 331-1 of the first n-type transistor 330-1 according to the present Modification Example is configured by the high concentration drain region 331-1e, a low concentration drain region 331-1c, the channel region 331-1a, a low concentration source region 331-1b, and the high concentration source region 331-1d. In other words, the first n-type transistor 330-1 according to the present Modification Example has an LDD structure where the low concentration impurity regions 331-1b and 331-1c (high resistance regions) are arranged at both sides of the channel region 331-1a of the semiconductor layer 331-1.

As shown in FIG. 14A, the semiconductor layer 311-2 of the second p-type transistor 310-2 according to the Modification Example is configured by a high concentration drain region 311-2e, a low concentration drain region 311-2c, the channel region 311-2a, a low concentration source region 311-2*b*, and a high concentration source region 311-2*d*. In other words, the second p-type transistor 310-2 according to the present Modification Example has an LDD structure where the low concentration impurity regions 311-2*b* and 311-2*c* (high resistance regions) are arranged at both sides of the channel region 311-2*a* of the semiconductor layer 311-2.

As shown in FIG. 14B, the semiconductor layer 331-2 of the second n-type transistor 330-2 according to the present Modification Example is configured by a high concentration drain region 331-2*e*, a low concentration drain region 331-2*c*, a channel region 331-2*a*, a low concentration source region 331-2*b*, and a high concentration source region 331-2*d*. In other words, the second n-type transistor 330-2 according to the present Modification Example has an LDD structure where the low concentration impurity regions 331-2*b* and 331-2*c* (high resistance regions) are arranged at both sides of the channel region 331-2*a* of the semiconductor layer 331-2.

In the present Modification Example, the impurity concentration in the LDD region of the transistor which configures the second static electricity protection circuit 302 is lower than the impurity concentration in the LDD region of the transistor which configures the first static electricity protection circuit 301 and the LDD region in the second static electricity protection circuit 302 has a higher resistance than the LDD region in the first static electricity protection circuit 301. As a result, the second p-type transistor 310-2 has a higher resistance than the first p-type transistor 310-1 and the second n-type transistor 330-2 has a higher resistance than the first n-type transistor 330-1. Accordingly, the second static electricity protection circuit 302 has a higher resistance than the first static electricity protection circuit 301.

In this manner, other than the method where the channel lengths or the channel widths of the transistors which configure the second static electricity protection circuit 302 and the first static electricity protection circuit 301 are adjusted, the second static electricity protection circuit 302 may have a higher resistance than the first static electricity protection circuit 301 by adjusting the impurity concentrations (resistance) in the LDD regions of the transistors which configure the second static electricity protection circuit 302 and the first static electricity protection circuit 301.

Furthermore, the second static electricity protection circuit 302 may have a higher resistance than the first static electricity protection circuit 301 by providing an offset region (omitted from the diagram) in the transistors which configure the second static electricity protection circuit 302 and the first static electricity protection circuit 301 and adjusting the dimensions of the offset region.

Modification Example 2

Figure 15A:
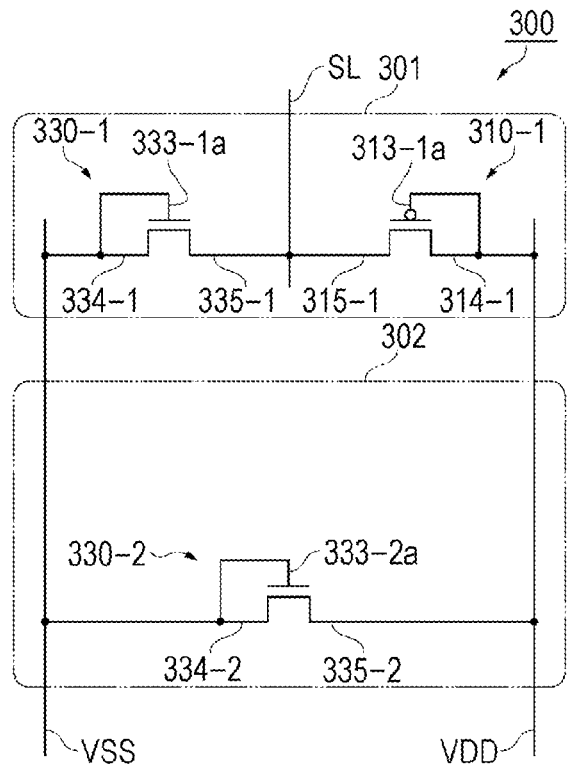
FIG. 15A is a circuit diagram which illustrates a configuration of a static electricity protection circuit according to Modification Example 2.
Figure 15B:
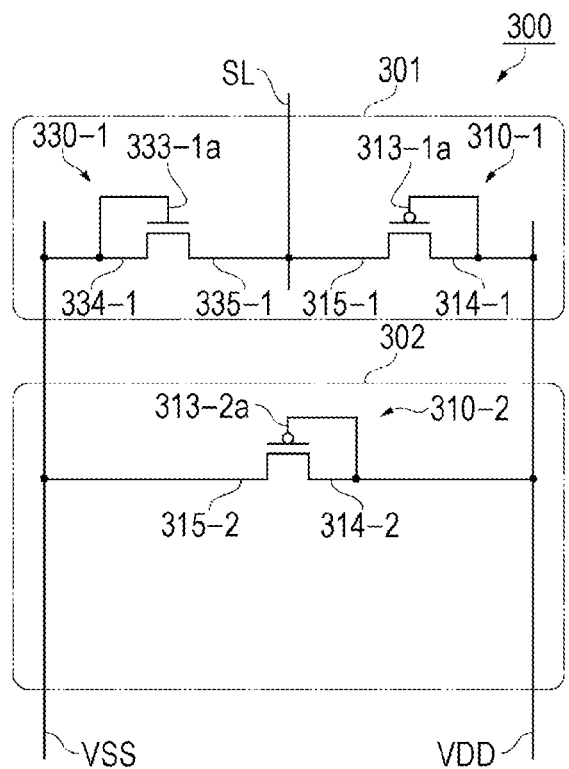
FIG. 15B is a circuit diagram which illustrates a configuration of another static electricity protection circuit according to Modification Example 2.

FIG. 15A and FIG. 15B correspond to FIG. 5 and is a circuit diagram which illustrates a configuration of a static electricity protection circuit according to Modification Example 2. Here, the same reference numerals will be given to the same configuration as Embodiment 1 and detailed description thereof will be omitted.

The different point between the static electricity protection circuit 300 according to Embodiment 1 and the static electricity protection circuit 300 according to the present Modification Example is in the configuration of the second static electricity protection circuit 302.

In detail, the second static electricity protection circuit 302 of Embodiment 1 is configured by the second n-type transistor 330-2 and the second p-type transistor 310-2 (refer to FIG. 5). As shown in FIG. 15A, the second static electricity protection circuit 302 of the present Modification Example is configured by the second n-type transistor 330-2. Alternatively, as shown in FIG. 15B, the second static electricity protection circuit 302 is configured by the second p-type transistor 310-2. This point is the point of difference between the present Modification Example and Embodiment 1.

Also in the second static electricity protection circuit 302 which is configured by either the second n-type transistor 330-2 or the second p-type transistor 310-2, it is possible to suppress the influence of static electricity with respect to the low potential power wiring VSS and the high potential power wiring VDD in the same manner as the second static electricity protection circuit 302 of Embodiment 1 which is configured by both the second n-type transistor 330-2 and the second p-type transistor 310-2.

Furthermore, since the area of the second static electricity protection circuit 302 according to the present Modification Example is small compared to the area of the second static electricity protection circuit 302 according to Embodiment 1, it is possible to save space in the static electricity protection circuit 300.

As shown in the present Modification Example and Embodiment 1, the second static electricity protection circuit 302 may have a configuration where at least one of the second n-type transistor 330-2 and the second p-type transistor 310-2 is provided.

Modification Example 3

The static electricity protection circuit 300 is not limited to being applied to the liquid crystal apparatus 100 and, for example, is able to be applied to a light emitting apparatus which has organic electroluminescence elements. By applying the static electricity protection circuit 300, it is possible to provide a light emitting apparatus with high reliability which is not easily influenced by static electricity.

Furthermore, the static electricity protection circuit 300 may be applied to Micro Electro Mechanical Systems (MEMS) where a sensor, an actuator, an electronic circuit, and the like are formed on a semiconductor substrate, an insulator substrate, or the like, or to an electronic device which has a semiconductor circuit. For example, a static electricity protection circuit in an integrated circuit which is configured by an MOS transistor which is formed on a semiconductor substrate is also within the application range of the invention.

Modification Example 4

The static electricity protection circuit 300 may be electrically connected with a wiring to which the lowest potential is supplied (for example, the low potential power wiring VSS), a wiring with a potential which is higher than the potential of the lowest potential wiring (for example, a signal wiring SL), and a wiring to which the highest potential is supplied (for example, the high potential power wiring VDD). Furthermore, when there is a wiring to which such a potential is supplied, it is possible to arrange the static electricity protection circuit 300 at an arbitrary location in the liquid crystal apparatus (the electro-optical apparatus).

In detail, the static electricity protection circuit 300 is arranged in a region between the external circuit connection terminal 102 and the semiconductor circuits (the data line driving circuit 101, the sampling circuit 7, and the scan line driving circuit 104); however, the invention is not limited to this. For example, the static electricity protection circuit 300 may be arranged inside the data line driving circuit 101 or the scan line driving circuit 104 and may be arranged between the semiconductor circuits (the data line driving circuit 101, the sampling circuit 7, and the scan line driving circuit 104) and the display region E.

Furthermore, the static electricity protection circuit 300 is connected with the low potential power wiring VSS, the high potential power wiring VDD, and the signal wiring SL in Embodiment 1; however, the invention is not limited to this. For example, there may be a configuration where the static electricity protection circuit 300 is electrically connected with the signal wiring SL to which the lowest potential is supplied, the signal wiring SL to which the highest potential is supplied, and another signal wiring SL out of a plurality of signal wirings SL.

Modification Example 5

The electronic equipment to which the liquid crystal apparatus 100 according to Embodiment 1 is applied is not limited to the projection type display apparatus 1000 of Embodiment 2. For example, other than the projection type display apparatus 1000, it is possible to apply the liquid crystal apparatus according to Embodiment 1 to a projection type Head Up Display (HUD), a Head-Mounted Display (HMD), an e-book reader, a personal computer, a digital still camera, a liquid crystal television, a viewfinder type or direct-view monitor type video recorder, a car navigation system, an information terminal device such as a POS, or electronic equipment such as an electronic notebook.

Furthermore, even in electronic equipment where the static electricity protection circuit 300 according to Embodiment 1 is mounted, the influence of static electricity is suppressed and the reliability is high. That is, for electronic equipment which is provided with both or one of the static electricity protection circuit 300 and an electro-optical apparatus which has the static electricity protection circuit 300, the influence of static electricity is suppressed and the reliability is high.

REFERENCE SIGNS LIST 100 liquid crystal apparatus
300 static electricity protection circuit
301 first electrostatic protection circuit
310-1 first p-type transistor
313-1a gate
314-1 source
315-1 drain
330-1 first n-type transistor
333-1a gate
334-1 source
335-1 drain
302 second electrostatic protection circuit
310-2 second p-type transistor
313-2a gate
314-2 source
315-2 drain
330-2 second n-type transistor
333-2a gate
334-2 source
335-2 drain
VSS low potential power wiring
VDD high potential power wiring
SL signal wiring

The invention claimed is:

1. A static electricity protection circuit comprising:
a first static electricity protection circuit;
a second static electricity protection circuit;
a first power wiring;
a second power wiring; and
a signal wiring,
wherein
each of the first static electricity protection circuit and the second static electricity protection circuit is respectively electrically connected with the first power wiring, the second power wiring, and the signal wiring,
the first static electricity protection circuit is provided with a first transistor and a second transistor,
the second static electricity protection circuit is provided with a third transistor,
the first transistor is an n-type transistor,
the second transistor is a p-type transistor,
the third transistor is either an n-type or a p-type transistor,
one out of a source and a drain of each of the first transistor, the second transistor, and the third transistor is electrically connected with a gate,
the gate of the first transistor is electrically connected with the first power wiring,
the other out of the source and the drain of the first transistor is electrically connected with the signal wiring,
the gate of the second transistor is electrically connected with the second power wiring,
the other out of the source and the drain of the second transistor is electrically connected with the signal wiring, and
the other out of the source and the drain of the third transistor is electrically connected with the first power wiring or the second power wiring.

2. The static electricity protection circuit according to claim 1,
wherein
the second static electricity protection circuit is provided with a fourth transistor,
the third transistor is an n-type transistor,
the fourth transistor is a p-type transistor,
one out of a source and a drain of the fourth transistor is electrically connected with a gate,
the gate of the third transistor and the other out of the source and the drain of the fourth transistor are electrically connected with the first power wiring, and
the gate of the fourth transistor and the other out of the source and the drain of the third transistor are electrically connected with the second power wiring.

3. The static electricity protection circuit according to claim 1,
wherein the second static electricity protection circuit has a higher resistance than the first static electricity protection circuit.

4. The static electricity protection circuit according to claim 1,
wherein
the first transistor and the third transistor have substantially the same channel width,
the second transistor and the fourth transistor have substantially the same channel width,
a channel length of the third transistor is 120% of the channel length of the first transistor or is longer than 120%, and the channel length of the fourth transistor is 120% of the channel length of the second transistor or is longer than 120%.

5. An electro-optical apparatus comprising the static electricity protection circuit according to claim 1.

6. An electronic equipment comprising the static electricity protection circuit according to claim 1.

* * * * *